United States Patent
Yamashita

(10) Patent No.: US 9,018,653 B2
(45) Date of Patent: Apr. 28, 2015

(54) LIGHT EMITTING DEVICE, CIRCUIT BOARD, PACKAGING ARRAY FOR LIGHT EMITTING DEVICE, AND METHOD FOR MANUFACTURING PACKAGING ARRAY FOR LIGHT EMITTING DEVICE

(75) Inventor: Ryohei Yamashita, Tokushima (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/820,322

(22) PCT Filed: Sep. 1, 2011

(86) PCT No.: PCT/JP2011/069915
§ 371 (c)(1),
(2), (4) Date: Mar. 4, 2013

(87) PCT Pub. No.: WO2012/029910
PCT Pub. Date: Mar. 8, 2012

(65) Prior Publication Data
US 2013/0153942 A1    Jun. 20, 2013

(30) Foreign Application Priority Data

Sep. 3, 2010 (JP) ................................ 2010-198371
Nov. 11, 2010 (JP) ................................ 2010-253159

(51) Int. Cl.
*H01L 33/62* (2010.01)
*H01L 33/48* (2010.01)

(52) U.S. Cl.
CPC .............. *H01L 33/62* (2013.01); *H01L 33/486* (2013.01); *H01L 2224/48247* (2013.01)

(58) Field of Classification Search
CPC ........... H01L 2224/48091; H01L 2924/00014; H01L 33/486

USPC ..................................................... 257/95–98
See application file for complete search history.

(56) References Cited

U.S. PATENT DOCUMENTS

| 7,312,479 | B2 * | 12/2007 | Fujii ............................. 257/100 |
| 7,768,029 | B2 * | 8/2010 | Matsumura et al. ............ 257/99 |
| 2009/0218122 | A1 | 9/2009 | Fukase |
| 2009/0315068 | A1 * | 12/2009 | Oshio et al. ................... 257/103 |
| 2011/0210354 | A1 | 9/2011 | Ichikawa et al. |

FOREIGN PATENT DOCUMENTS

| JP | 2000-196000 A | 7/2000 |
| JP | 2007-134376 A | 5/2007 |
| JP | 2009-212228 A | 9/2009 |
| JP | 2010-003743 A | 1/2010 |
| JP | 2010-062272 A | 3/2010 |

* cited by examiner

*Primary Examiner* — David Vu
*Assistant Examiner* — Jonathan Han
(74) *Attorney, Agent, or Firm* — Global IP Counselors, LLP

(57) ABSTRACT

A light emitting device includes a light emitting element and a package. The package is made up of a molded article and a lead that is embedded in the molded article. The lead includes a mounting part on which the light emitting element is mounted, a terminal part that is linked to the mounting part, and an exposed part. The package has a front face that is a light emitting face, a rear face opposite the front face, and a bottom face contiguous with the front face and the rear face. The light emitting element is mounted on the front face side of the mounting part. The exposed part is linked to the rear face side of the mounting part, and is exposed from the molded article at the bottom face and the rear face. The terminal part is exposed from the molded article at the bottom face.

12 Claims, 22 Drawing Sheets

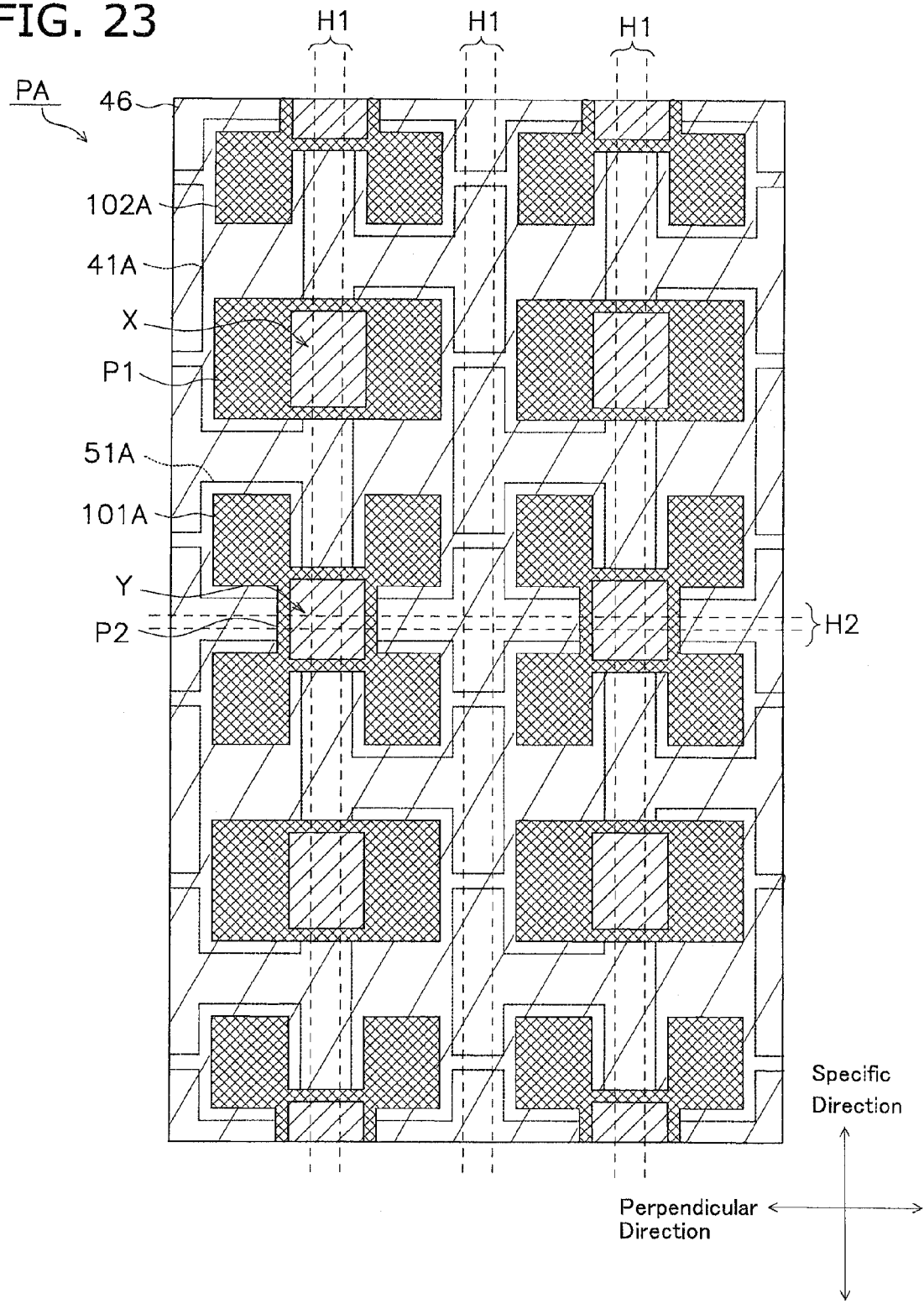

LIGHT EMITTING DEVICE, CIRCUIT BOARD, PACKAGING ARRAY FOR LIGHT EMITTING DEVICE, AND METHOD FOR MANUFACTURING PACKAGING ARRAY FOR LIGHT EMITTING DEVICE

CROSS-REFERENCE TO RELATED APPLICATIONS

This application claims priority to Japanese Patent Application No. 2010-198371 filed on Sep. 3, 2010 and Japanese Patent Application No. 2010-253159 filed on Nov. 11, 2010, the disclosures of which are hereby incorporated herein by reference in their entirety.

TECHNICAL FIELD

The technology disclosed herein relates to a light emitting device equipped with a light emitting element, and to a circuit board comprising the light emitting device and a mounting board.

BACKGROUND INFORMATION

As the output of light emitting elements (such as light emitting diodes or laser diodes) used in LCD television backlights, lighting fixtures, optical communications devices, and so forth has risen in recent years, there has been a need for a technique with which heat can be efficiently dissipated from the light emitting element.

There is a known light emitting device comprising a light emitting element and a package in which the light emitting element is mounted (see Japanese Laid-Open Patent Application Publication No. 2010-62272, for example). The package has a molded article made of resin and so on, and a metal lead that is embedded in the molded article. The lead includes a mounting part on which the light emitting element is mounted, and a terminal part that is linked to the mounting part and is connected to a mounting board via a solder fillet.

SUMMARY

With this light emitting device, the thermal transmittance of the molded article is far lower than that of the lead, so a path that leads to the mounting board via the mounting part, the terminal part, and the solder fillet, in that order, is dominant as the heat dissipation path from the light emitting element.

However, because of the small surface area of the portion of the terminal part that is exposed from the molded article, and because of the long distance from the light emitting element to the terminal part, it is difficult to achieve efficient heat dissipation from the light emitting element when the above-mentioned path is dominant.

The technology disclosed herein was conceived in light of the above situation and is an object thereof to provide a light emitting device, a circuit board, a package array for a light emitting device, and a method for manufacturing a package array for a light emitting device, with which heat can be efficiently dissipated from the light emitting element.

The light emitting device disclosed herein comprises a light emitting element and a package. The package is constituted by a molded article and a lead embedded in the molded article. The lead includes a mounting part, a terminal part and an exposed part. The light emitting element is mounted on the mounting part. The terminal part is linked to the mounting part. The package has a light emission face, a rear face opposite to the light emission face, and a bottom face communicating the light emission face and the rear face. The light emitting element is mounted on a light emission face side of the mounting part. The exposed part is linked to a rear face side of the mounting part. The exposed part is exposed from the molded article at the bottom face and the rear face. The terminal part is exposed from the molded article at the bottom face.

The technology disclosed herein can provide a light emitting device, a circuit board, a package array for a light emitting device, and a method for manufacturing a package array for a light emitting device, with which heat can be efficiently dissipated from the light emitting element.

BRIEF DESCRIPTION OF DRAWINGS

FIG. 23 is a diagram illustrating a method for manufacturing the light emitting device 100 pertaining to the fifth embodiment.

DETAILED DESCRIPTION OF EMBODIMENTS

Embodiments of the present invention will now be described through reference to the drawings. In the discussion of the drawings below, portions that are the same or similar will be given the same or similar numbers. The drawings, however, are merely representations, and the proportions of the various dimensions may vary from those in actuality. Therefore, specific dimensions and so forth should be decided on by referring to the following description. Also, the dimensional relations and proportions of some portions may, of course, vary from one drawing to the next.

First Embodiment

Summary of First Embodiment

In the first embodiment, we will describe a light emitting device with which heat can be efficiently dissipated from the light emitting element, and a circuit board comprising this light emitting device and a mounting board. More specifically, the light emitting device has an exposed part that functions as a heat sink to promote the dissipation of heat from the light emitting element.

The configuration of the light emitting device, mounting board, and circuit board, and the method for manufacturing the light emitting device, will now be described in order.

Configuration of Light Emitting Device

Figure 1:
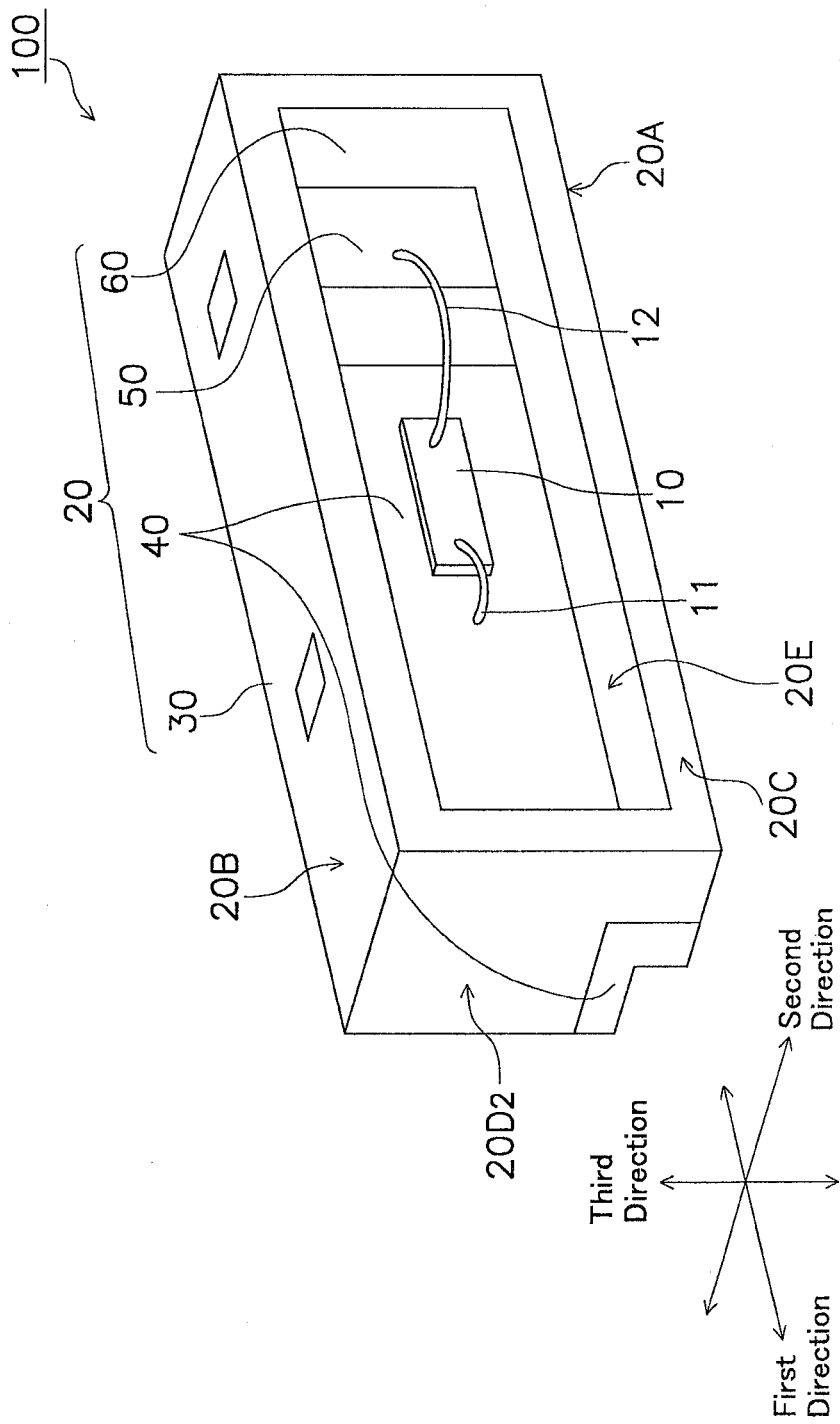
FIG. 1 is an oblique view of a light emitting device 100 pertaining to a first embodiment, as seen from the front.
Figure 2:
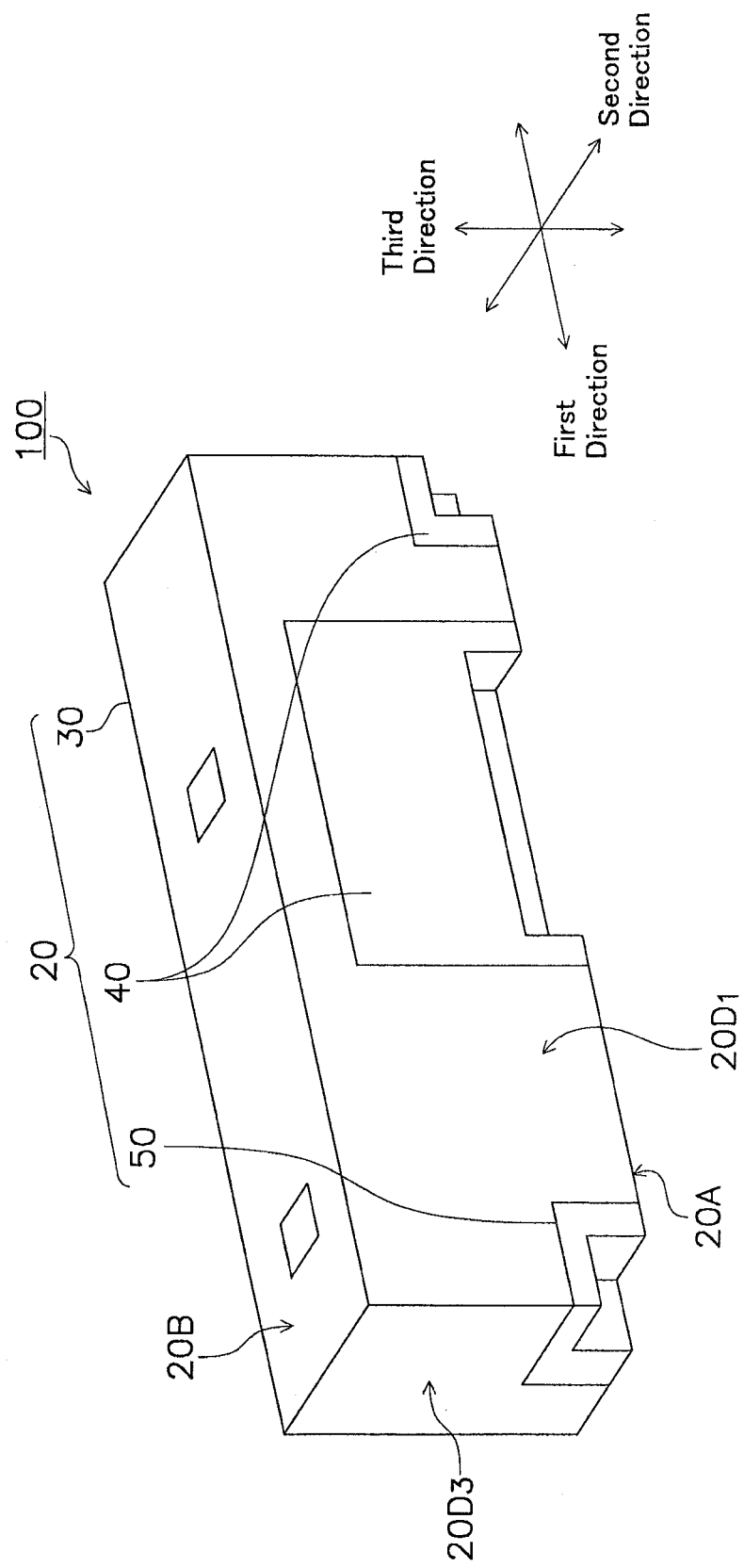
FIG. 2 is an oblique view of the light emitting device 100 pertaining to the first embodiment, as seen from the rear.

The configuration of the light emitting device pertaining to the first embodiment will be described through reference to the drawings. FIG. 1 is an oblique view of a light emitting device 100 pertaining to the first embodiment, as seen from the front. FIG. 2 is an oblique view of a light emitting device 100 pertaining to the first embodiment, as seen from the rear.

The light emitting device 100 comprises a light emitting element 10 and a package 20. The light emitting device 100 pertaining to this embodiment is what is known as a side-view type of light emitting device, and light emitted from the light emitting element 10 is taken off in a direction parallel to a mounting face 200A (see FIG. 7) of a mounting board 200 (discussed below).

In this embodiment, the light emitting device 100 has a substantially cuboid shape that extends along a first direction parallel to the mounting face 200A. However, the outer shape of the light emitting device 100 is not limited to this, and may be a cubic shape, a circular cylindrical shape, an elliptical cylindrical shape, or the like.

In this embodiment, the size of the light emitting device 100 is approximately 3 mm in the first direction, about 1 mm in a direction parallel to the mounting face 200A and perpendicular to the first direction (hereinafter referred to as the "second direction"), and about 1 mm in a direction perpendicular to the first direction and the second direction (that is, a direction perpendicular to the mounting face 200A; hereinafter referred to as the "third direction"). The size of the light emitting device 100 is not limited to this, however.

The light emitting device 100 pertaining to this embodiment, however, is a side view type, and its height in the third direction is greater than its depth in the second direction. Therefore, the side view-type light emitting device 100 is taller than a top view type of light emitting device in which the height in the third direction is less than the depth in the second direction, so it is characterized by a tendency to topple.

Light Emitting Element 10

The light emitting element 10 is placed in the package 20. The light emitting element 10 is electrically connected to the package 20 via a first wire 11 and a second wire 12.

The light emitting element 10 is formed in a flat shape, and is disposed perpendicular to the second direction. The emitted light from the light emitting element 10 is taken off in a direction parallel to the second direction, from a front face opening 20E (discussed below).

The light emitting element 10 is a semiconductor light emitting element called a light emitting diode, for example. The light emitting element 10 preferably has as its light emitting layer a semiconductor such as GaAlN, ZnS, SnSe, SiC, GaP, GaAlAs, AlN, InN, AlInGaP, InGaN, GaN, or AlInGaN on a substrate, but is not limited to this.

A face-up structure or a face-down structure can be employed for the light emitting element 10. There are no particular restrictions on the size of the light emitting element 10, but examples include 350 μm square, 500 μm square, and 1 mm square.

Package 20

In this embodiment, the package 20 has a substantially cuboid shape that extends in the first direction. The package 20 has a bottom face 20A, a top face 20B, a front face 20C, a first side face $20D_1$ (corresponds to the "rear face" of the side-view light emitting device 100), a second side face $20D_2$, and a third side face $20D_3$.

The bottom face 20A hits the mounting face 200A (see FIG. 7) when the light emitting device 100 is mounted. The top face 20B is provided opposite the bottom face 20A. The front face 20C is a light emission face that is contiguous with the bottom face 20A and the top face 20B. The front face 20C has a front face opening 20E. The front face opening 20E guides the light emitted from the light emitting element 10 to outside the package 20. The light emitting element 10 is placed on a mounting face 41A (see FIG. 3) exposed in the interior of the front face opening 20E. The first side face $20D_1$ is contiguous with the bottom face 20A and the top face 20B, and is provided opposite the front face 20C. The first side face $20D_1$ is perpendicular to the second direction (that is, a direction in which the light emitted by the light emitting element is taken off). The boundary between the first side face $20D_1$ and the bottom face 20A is parallel to the first direction. The second side face $20D_2$ is contiguous with the first side face $20D_1$ and the front face 20C. The third side face $20D_3$ is provided opposite the second side face $20D_2$. The second side face $20D_2$ and the third side face $20D_3$ are perpendicular to the first direction.

The package 20 is made up of a molded article 30, a first lead 40, a second lead 50, and a sealing resin 60.

(1) Molded Article 30

The molded article 30 forms the outer shape of the package 20. The molded article 30 is heat resistant and has the required strength, and is made of an electrically insulating material that does not readily transmit outside light, the light emitted from the light emitting element 10, or other such light. A favorable example of this material is a triazine derivative epoxy resin, which is a thermosetting resin. This thermosetting resin may contain an acid anhydride, an antioxidant, a parting agent, a light reflecting member, an inorganic filler, a curing catalyst, a light stabilizer, and a lubricant. Titanium dioxide, added in an amount of 0.1 to 90 wt %, and preferably 10 to 60 wt %, can be used as the light reflecting member. The material of the molded article 30 is not limited to this, however, and can be, for example, one or more types of thermosetting resin selected from among epoxy resins, modified epoxy resins, silicone resins, modified silicone resins, acrylate resins, and urethane resins. Epoxy resins, modified epoxy resins, silicone resins, and modified silicone resins are particularly favorable as the material for the molded article 30. A thermoplastic resin may also be used, such as a liquid crystal polymer, a polyphthalamide resin, or polybutylene terephthalate (PBT).

(2) First Lead 40 and Second Lead 50

The first lead 40 and the second lead 50 are preferably made of a material having a relatively high thermal conductivity (such as at least about 200 W/(m·K)). This allows any heat generated from the light emitting element 10 to be efficiently transmitted. Examples of such a material include one or more layers of nickel, gold, copper, silver, molybdenum, tungsten, aluminum, iron, or another such metal, or of an iron-nickel alloy, phosphor bronze, ferrous copper, or another such alloy. The surfaces of the first lead 40 and the second lead 50 may also be plated.

The majority of the first lead 40 and the second lead 50 is embedded in the molded article 30, and just parts of the first lead 40 and the second lead 50 are exposed from the molded article 30. Specifically, just parts of the first lead 40 and the second lead 50 can be seen from the outside of the package 20. The configuration of the first lead 40 and the second lead 50 will be discussed below.

(3) Sealing Resin 60

The sealing resin 60 is packed into the interior of the front face opening 20E, and seals the light emitting element 10. This sealing resin 60 can be a translucent resin, such as one or more types of resin selected from among polyolefin resins, polycarbonate resins, polystyrene resins, epoxy resins, acrylic resins, acrylate resins, methacrylic resins (PMMA, etc.), urethane resins, polyimide resins, polynorbornene resins, fluororesins, silicone resins, modified silicone resins, and modified epoxy resins. This material may also contain a diffusion agent, filler, pigment, fluorescent substance, etc., as discussed in Japanese Laid-Open Patent Application 2006-229055 and WO2006/038502.

Lead Configuration

Figure 3:
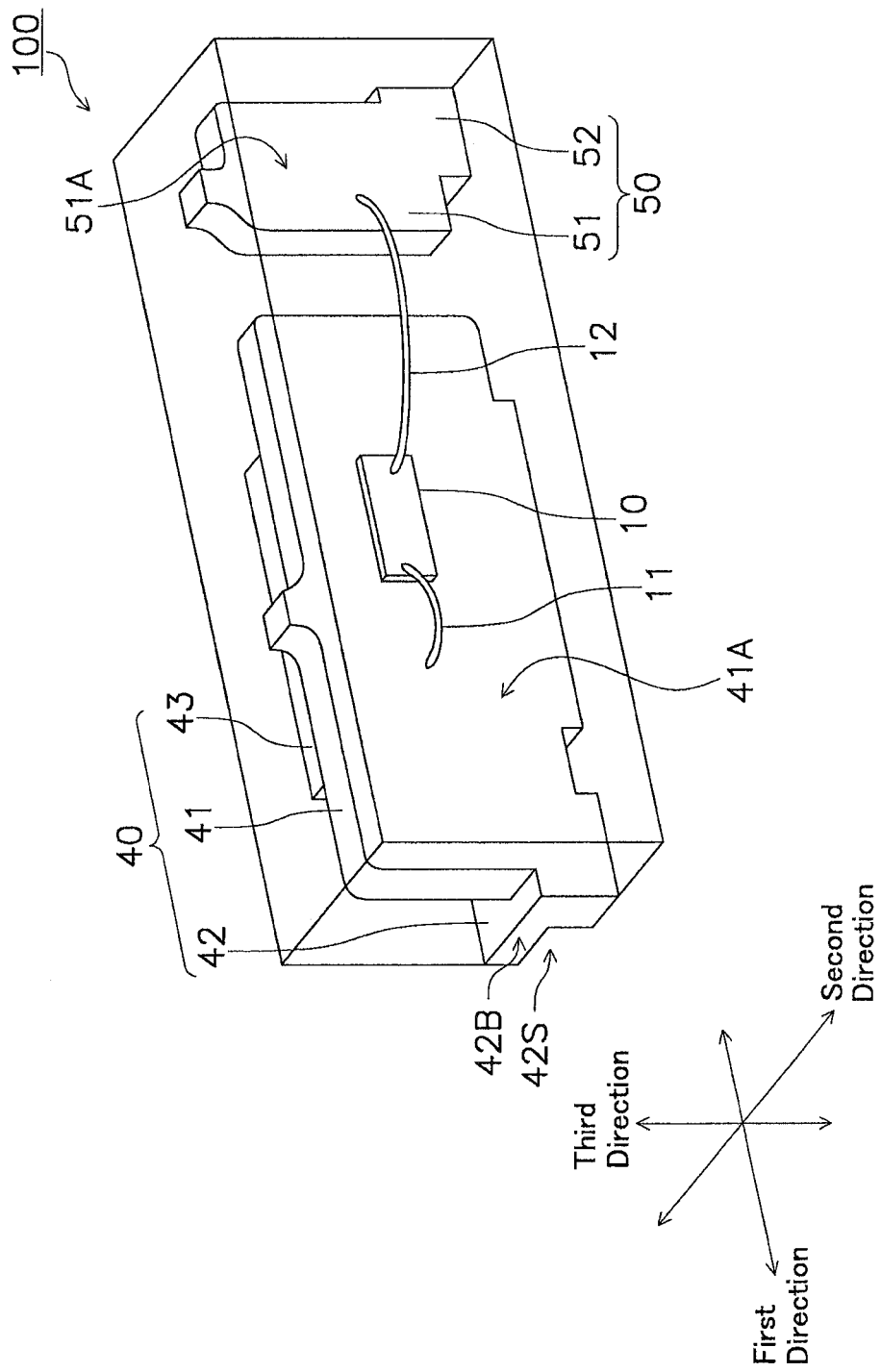
FIG. 3 is a see-through view of FIG. 1.
Figure 4:
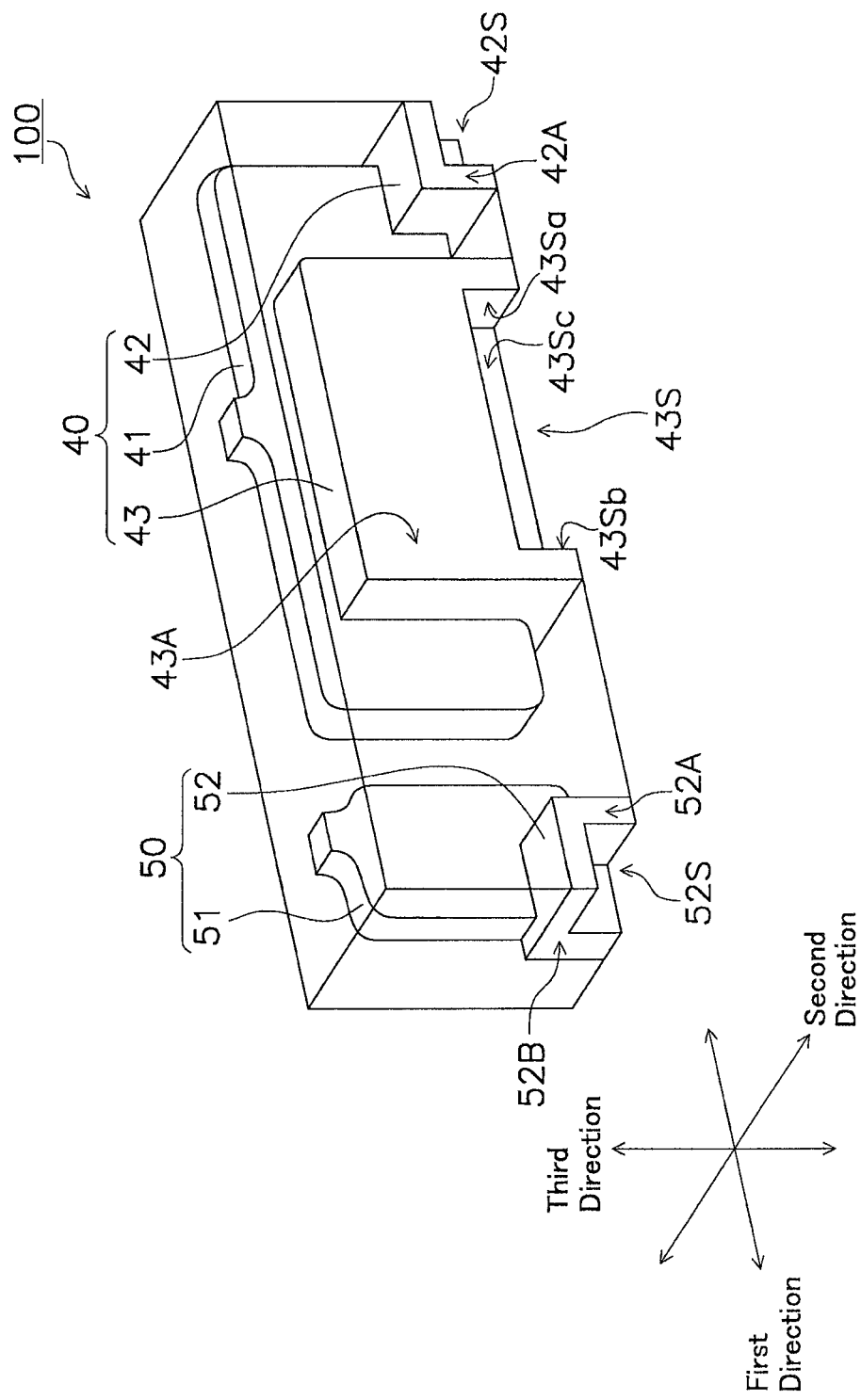
FIG. 4 is a see-through view of FIG. 2.
Figure 5:
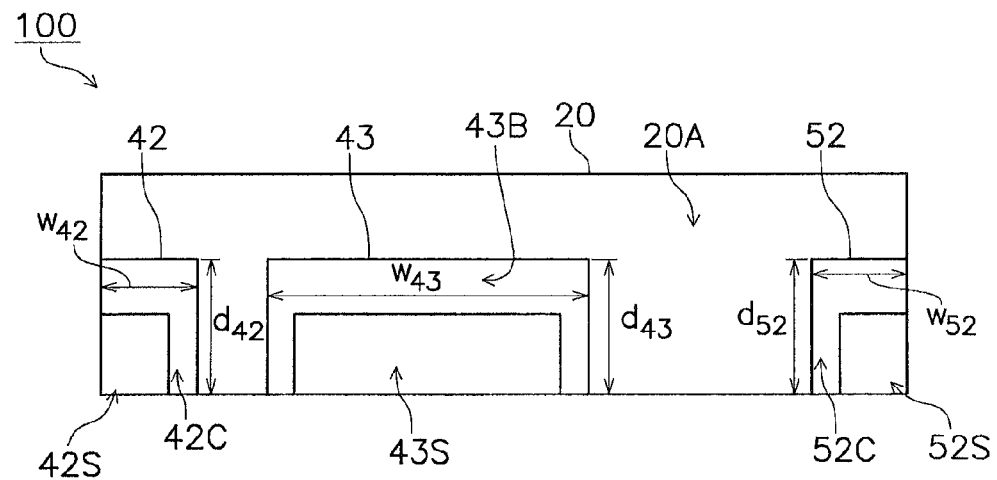
FIG. 5 is a plan view of a bottom face 20A of the light emitting device 100 pertaining to the first embodiment.
Figure 6:
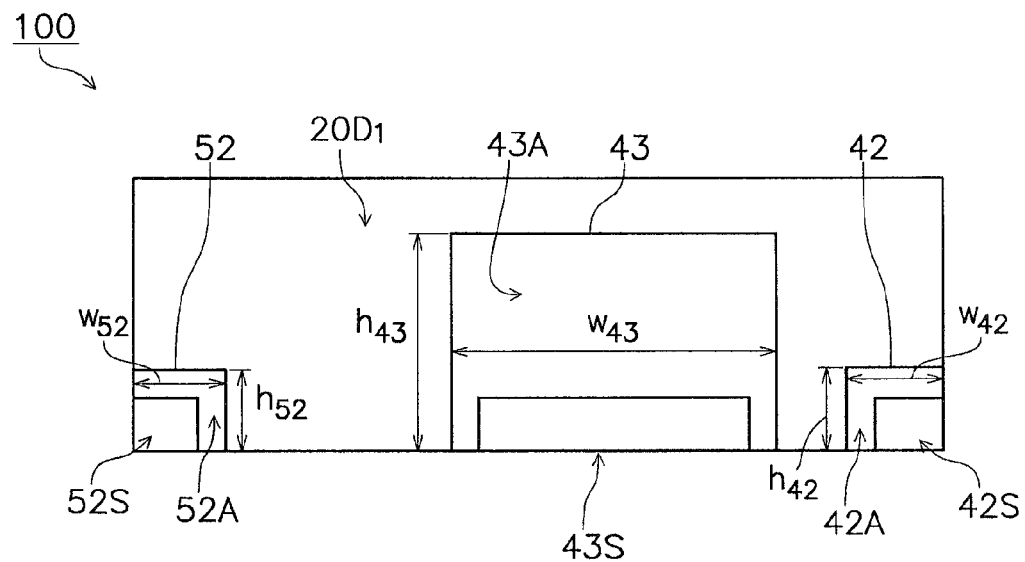
FIG. 6 is a plan view of a first side face $20D_1$ of the light emitting device 100 pertaining to the first embodiment.

Next, the configuration of the leads pertaining to the embodiment will be described through reference to the drawings. FIG. 3 is a see-through view of FIG. 1. FIG. 4 is a see-through view of FIG. 2. FIG. 5 is a plan view of a bottom face 20A of the light emitting device 100 pertaining to the first embodiment. FIG. 6 is a plan view of the first side face 20D1 of the light emitting device 100. In FIGS. 3 and 4, the molded article 30 is shown in outline.

In the following description, the dimension in the first direction is called "width," the dimension in the second direction is called "depth," and the dimension in the third direction is called "height."

Configuration of First Lead 40

The first lead 40 is made up of a mounting part 41, a first terminal part 42, and an exposed part 43. In this embodiment, the first terminal part 42 and the exposed part 43 are integrally linked to the mounting part 41. Therefore, the first terminal part 42 and the exposed part 43 are connected mechanically and electrically to the mounting part 41. The first terminal part 42 and the exposed part 43, however, are separated from one another, and are not directly linked.

(1) Mounting part 41

The mounting part 41 is formed in a flat shape, and is disposed along the first side face $20D_1$. The first to third side faces $20D_1$ to $20D_3$ of the mounting part 41 are covered by the molded article 30. The mounting part 41, meanwhile, has the mounting face 41A that is exposed from the molded article 30.

The first mounting face 41A is exposed from the molded article 30 in the interior of the front face opening 20E. The light emitting element 10 is placed in the first mounting face 41A, and the first wire 11 is also connected to the first mounting face 41A. The first mounting face 41A is sealed by the sealing resin 60 (see FIG. 1).

(2) First Terminal Part 42

The first terminal part 42 is formed in a three-dimensional shape, and is linked to the lower end of the mounting part 41 on the second side face $20D_2$ side. Part of the first terminal part 42 is exposed from the molded article 30, and functions as an external electrode of the light emitting device 100. The first terminal part 42 has a first end face 42A, a second end face 42B, a third end face 42C, and a first terminal concavity 42S.

The first end face 42A is exposed from the molded article 30 at the first side face $20D_1$ of the package 20. The first end face 42A forms part of the first side face $20D_1$. The second end face 42B is exposed from the molded article 30 at the second side face $20D_2$ of the package 20. The second end face 42B forms part of the second side face $20D_2$. The third end face 42C is exposed from the molded article 30 at the bottom face 20A of the package 20. The third end face 42C forms part of the bottom face 20A. The first terminal concavity 42S is a cut-out formed at the boundary between the bottom face 20A, the first side face $20D_1$, and the second side face $20D_2$.

Figure 8:
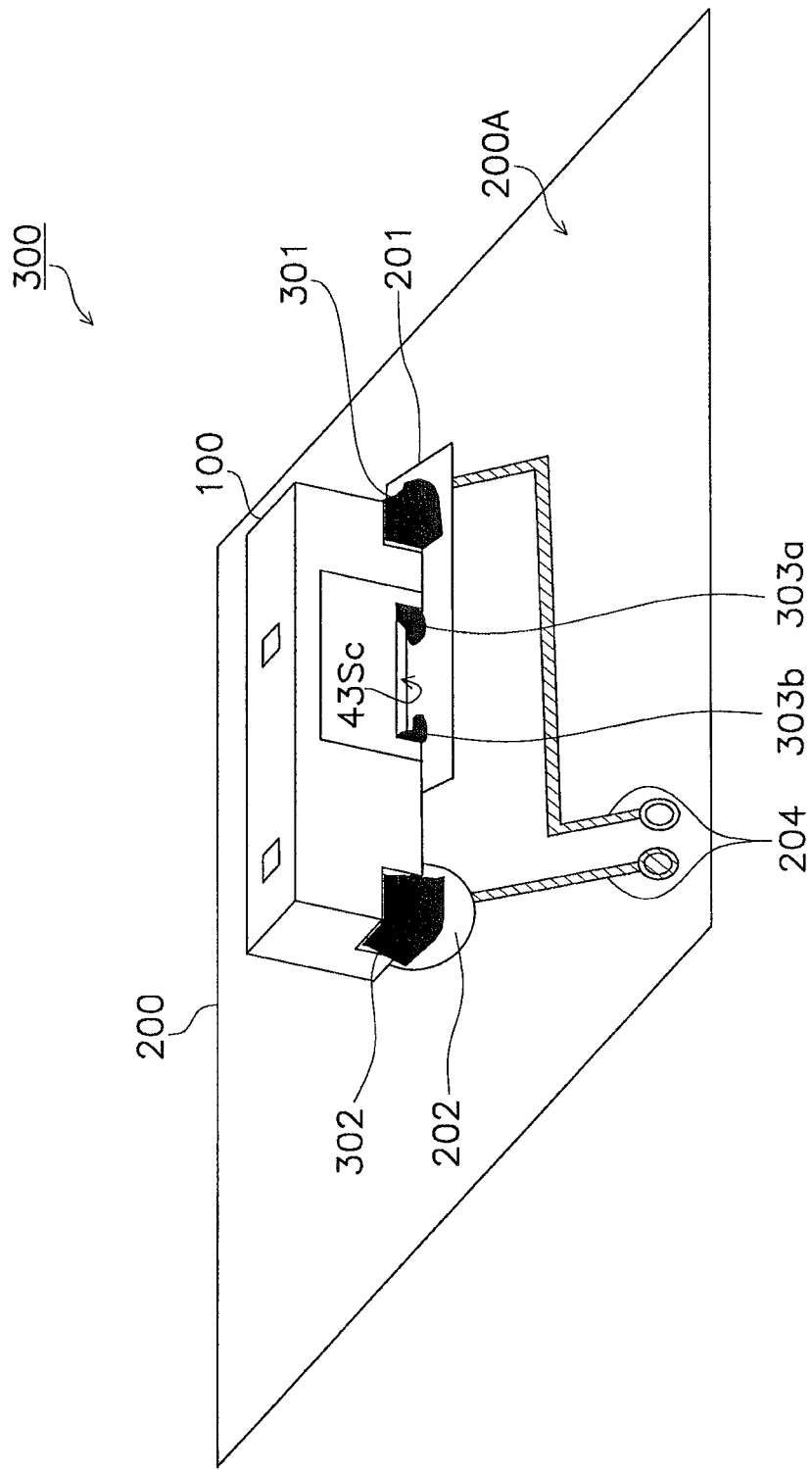
FIG. 8 is an oblique view of the mounting face of a circuit board 300 pertaining to the first embodiment.

In this embodiment, when the light emitting device 100 is mounted, a first solder fillet 301 is formed on the first end face 42A and the second end face 42B, and the first terminal concave component 42S is filled with part of the first solder fillet 301 (see FIG. 8). Also, when the light emitting device 100 is mounted, the third end face 42C is in contact with the mounting face 200A.

(3) Exposed Part 43

The exposed part 43 is formed in an L shape, and is linked to the first side face $20D_1$ (rear face) side and the bottom face 20A side of the mounting part 41. Part of the exposed part 43 is exposed from the molded article 30 and functions as a heat sink.

The exposed part 43 has a first exposed face 43A, a second exposed face 43B, and a concave component 43S (an example of a "concave component").

The first exposed face 43A is exposed from the molded article 30 at the first side face $20D_1$. The first exposed face 43A forms part of the first side face $20D_1$. The surface area of the first exposed face 43A is larger than the surface area of the first end face 42A. More specifically, as shown in FIG. 6, the height $h_{43}$ of the first exposed face 43A is greater than the height $h_{42}$ of the first end face 42A, and the width $w_{43}$ of the first exposed face 43A is greater than the width $w_{42}$ of the first end face 42A.

The second exposed face 43B is exposed from the molded article 30 at the bottom face 20A of the package 20. The second exposed face 43B forms part of the bottom face 20A. The surface area of the second exposed face 43B is greater than the surface area of the third end face 42C. More specifically, as shown in FIG. 5, the depth $d_{43}$ of the second exposed face 43B is the same as the depth $d_{42}$ of the third end face 42C, but the width $w_{43}$ of the second exposed face 43B is greater than the width $w_{42}$ of the third end face 42C.

The concavity 43S is a cut-out formed in part of the boundary between the bottom face 20A and the first side face $20D_1$. Therefore, the concavity 43S continuously opens on the bottom face 20A and the first side face $20D_1$. The concave component 43S is formed so as to extend in the first direction.

As shown in FIG. 4, the concavity 43S has a first inner wall 43Sa, a second inner wall 43Sb, and a third inner wall 43Sc. The first inner wall 43Sa is perpendicular to the first direction. The second inner wall 43Sb is opposite the first inner wall 43Sa. The third inner wall 43Sc is perpendicular to the second direction and is contiguous with the first inner wall 43Sa and the second inner wall 43Sb.

In this embodiment, when the light emitting device 100 is mounted, the first exposed face 43A is exposed outside the light emitting device 100, and the second exposed face 43B is in contact with the mounting face 200A (see FIG. 8). When the light emitting device 100 is mounted, a second solder fillet 303a (an example of a "second solder fillet") is formed over the first inner wall 43Sa, and a second solder fillet 303b (an example of a "second solder fillet") is formed over the second inner wall 43Sb. Meanwhile, when the light emitting device 100 is mounted, the third inner wall 43Sc is exposed on the outside of the light emitting device 100.

In this embodiment, the exposed part 43 is electrically connected with the mounting board 200 via a pair of second solder fillets 303a and 303b, and thereby functions as an external electrode for the light emitting device 100 along with the first terminal part 42.

Configuration of Second Lead 50

The second lead 50 is made up of a connector 51 and the second terminal part 52. In this embodiment, the connector 51 and the second terminal part 52 are formed integrally.

(1) Connector 51

The connector 51 is formed in a flat shape, and is disposed along the first side face $20D_1$. The first to third side faces $20D_1$ to $20D_3$ of the connector 51 are covered by the molded article 30. Meanwhile, the connector 51 has a mounting face 51A that is exposed from the molded article 30.

The mounting face 51A is exposed from the molded article 30 in the interior of the front face opening 20E. The second wire 12 is connected to the mounting face 51A. This electrically connects the connector 51 and the light emitting element 10. The mounting face 51A is sealed by the sealing resin 60 (see FIG. 1).

(2) Second Terminal Part 52

The second terminal part 52 is formed in a three-dimensional shape, and is linked to an end of the connector 51. Part of the second terminal part 52 is exposed from the molded article 30, and functions as an external electrode of the light emitting device 100. The second terminal part 52 has a first end face 52A, a second end face 52B, a third end face 52C, and a second terminal concavity 52S.

The first end face 52A is exposed from the molded article 30 at the first side face $20D_1$ of the package 20. The first end face 52A forms part of the first side face $20D_1$. The second end face 52B is exposed from the molded article 30 at the third side face $20D_3$ of the package 20. The second end face 52B forms part of the third side face $20D_3$. The third end face 52C is exposed from the molded article 30 at the bottom face 20A of the package 20. The third end face 52C forms part of the bottom face 20A. The second terminal concavity 52S is a cut-out formed at the boundary between the bottom face 20A, the first side face $20D_1$, and the third side face $20D_3$.

In this embodiment, when the light emitting device 100 is mounted, a third solder fillet 302 is formed on the first end face 52A and on the second end face 52B, and the second terminal concave component 52S is filled with part of the third solder fillet 302 (see FIG. 8). Also, when the light emitting device 100 is mounted, the third end face 52C is in contact with the mounting face 200A.

The surface area of the first exposed face 43A is greater than the surface area of the first end face 52A. More specifically, as shown in FIG. 6, the height $h_{43}$ of the first exposed face 43A is greater than the height $h_{52}$ of the first end face 52A, and the width $w_{43}$ of the first exposed face 43A is greater than the width $w_{52}$ of the first end face 52A.

Also, the surface area of the second exposed face 43B is greater than the surface area of the third end face 52C. More specifically, as shown in FIG. 5, the depth $d_{43}$ of the second exposed face 43B is the same as the depth $d_{52}$ of the third end face 52C, but the width $w_{43}$ of the second exposed face 43B is greater than the width $w_{52}$ of the third end face 52C.

Configuration of Mounting Board

Figure 7:
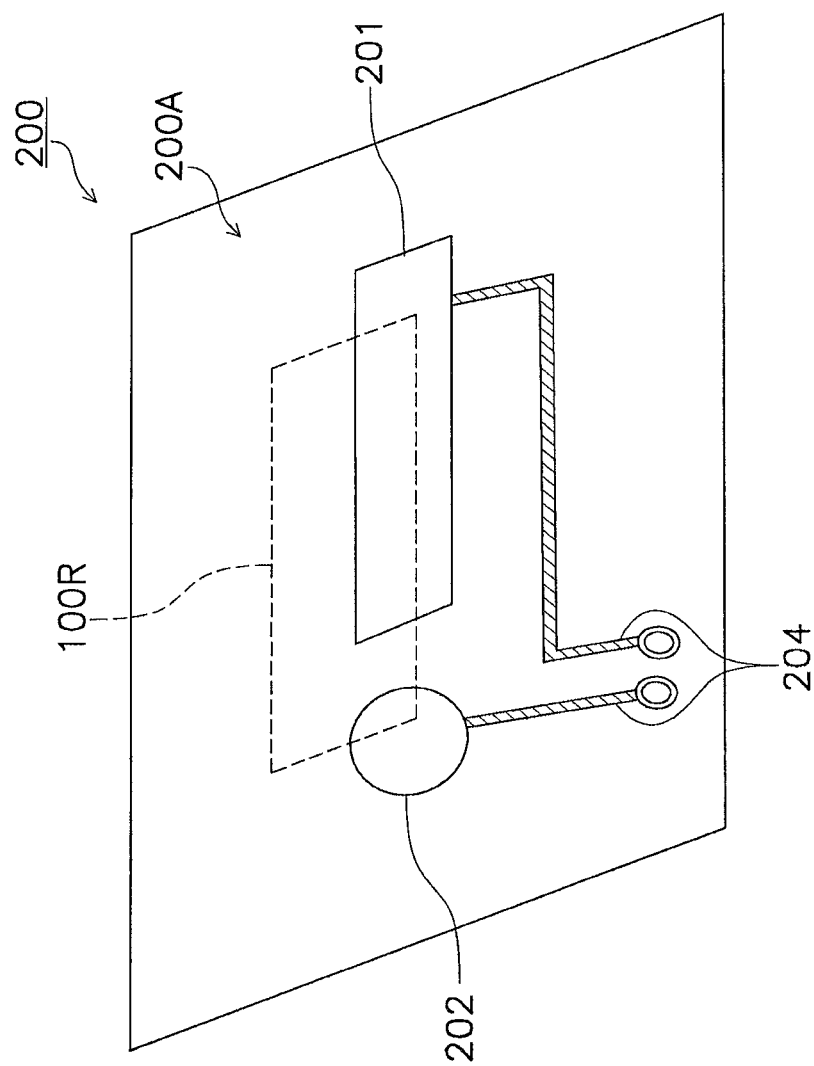
FIG. 7 is an oblique view of the mounting face of a mounting board 200 pertaining to the first embodiment.

Next, the configuration of the mounting board pertaining to the first embodiment will be described though reference to the drawings. FIG. 7 is an oblique view of the mounting face of a mounting board 200 pertaining to the first embodiment. In FIG. 7, the region where the light emitting device 100 is mounted is shown as a mounting region 100R.

As shown in FIG. 7, the mounting board 200 has the mounting face mounting face 200A, a first land 201, a second land 202, and an electrical circuit 204.

The light emitting device 100 is mounted on the mounting face 200A. The first land 201 is a metal member for connecting the first terminal part 42. The second land 202 is a metal member for connecting the second terminal part 52. Copper foil or the like can be used, for example, as the first land 201 and the second land 202. The surfaces of the first land 201 and the second land 202 form part of the mounting face 200A.

The electrical circuit 204 is connected to the first land 201 and the second land 202. Consequently, the first land 201 functions as an external terminal corresponding to the first terminal part 42 and the exposed part 43, and the second land 202 functions as an external terminal corresponding to the second terminal part 52.

Configuration of Circuit Board

Next, the configuration of the circuit board pertaining to the first embodiment will be described through reference to the drawings. FIG. 8 is an oblique view of the mounting face of a circuit board 300 pertaining to the first embodiment.

As shown in FIG. 8, the circuit board 300 comprises the light emitting device 100, the mounting board 200, the first solder fillet 301, the pair of second solder fillet 303a and 303b (an example of a "second solder fillet"), and a third solder fillets 303.

The first solder fillet 301 is formed on the mounting face 200A, the first side face 20D$_1$ and the second side face 20D$_2$. The first solder fillet 301 is held in the interior of the first terminal concavity 42S. Consequently, the first terminal part 42 and the first land 201 (that is the mounting board 200) are electrically and mechanically connected.

The third solder fillet 302 is formed on the mounting face 200A, the first side face 20D$_1$ and the third side face 20D$_3$. The third solder fillet 302 is packed in the interior of the second terminal concavity 52S. Consequently, the second terminal part 52 and the second land 202 (that is the mounting board 200) are electrically, mechanically, and thermally connected.

The pair of second solder fillets 303a and 303b are disposed in the interior of the concavity 43S. More specifically, the second solder fillet 303a is formed on the mounting face 200A and the first inner wall 43Sa, and the second solder fillet 303b is formed on the mounting face 200A and the second inner wall 43Sb. The second solder fillet 303a and the second solder fillet 303b are opposite one another. The second solder fillet 303a and the second solder fillet 303b mechanically and thermally connect the exposed part 43 and the first land 201 (that is the mounting board 200). The third inner wall 43Sc, meanwhile, is exposed on the outside of the light emitting device 100.

Heat Dissipation Path

Next, the path of heat dissipation from the light emitting element 10 pertaining to this embodiment will be described. Four examples of a heat dissipation path will be given, starting with the one with the highest heat dissipation efficiency.

First Heat Dissipation Path; Light emitting element 10→mounting part 41→43→pair of second solder fillets 303a and 303b→mounting board 200.

Second Heat Dissipation Path; Light emitting element 10→mounting part 41→exposed part 43→first exposed face 43A→outside air.

Third Heat Dissipation Path; Light emitting element 10→mounting part 41→exposed part 43→second exposed face 43B→mounting board 200.

Fourth Heat Dissipation Path; Light emitting element 10→mounting part 41→first terminal part 42→first solder fillet 301→mounting board 200.

Method for Manufacturing Light Emitting Devices

Figure 9A:
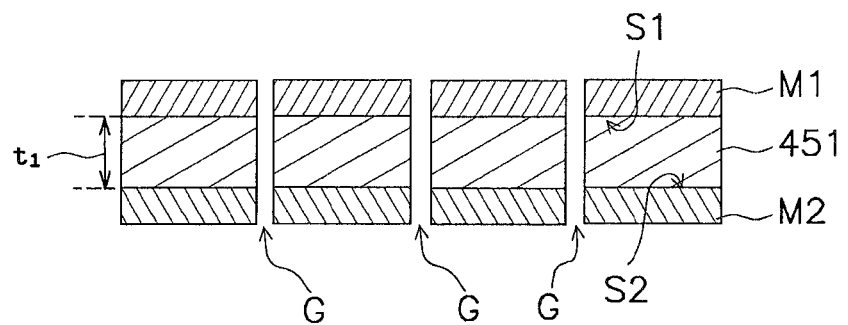
FIG. 9 is a diagram illustrating a method for manufacturing the circuit board 300 pertaining to the first embodiment.
Figure 9B:
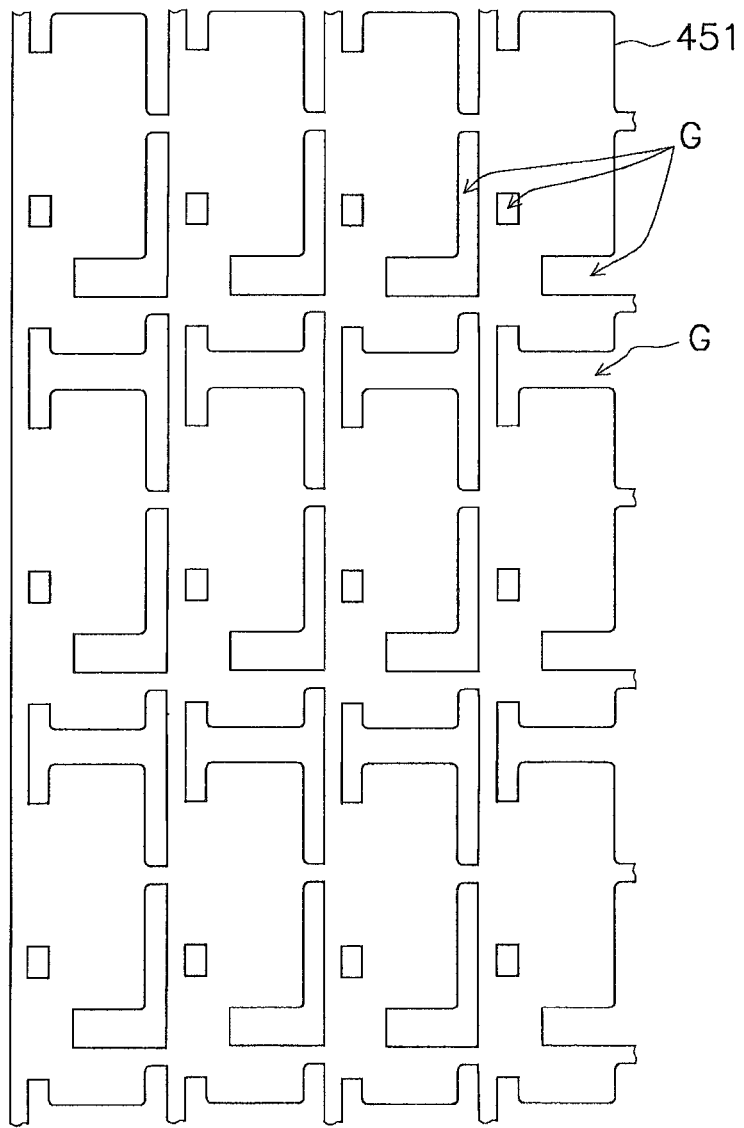
Figure 10A:
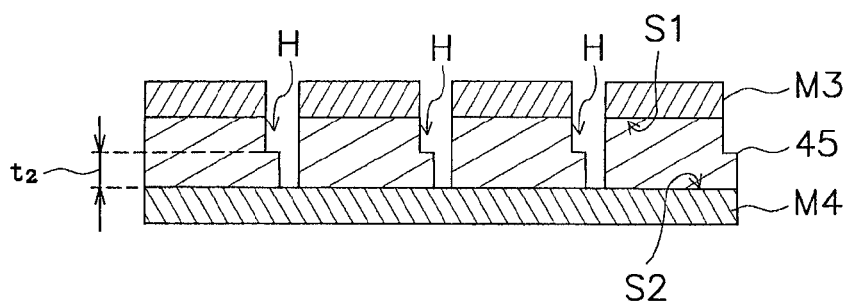
FIG. 10 is a diagram illustrating a method for manufacturing the light emitting device 100 pertaining to the first embodiment.
Figure 10B:
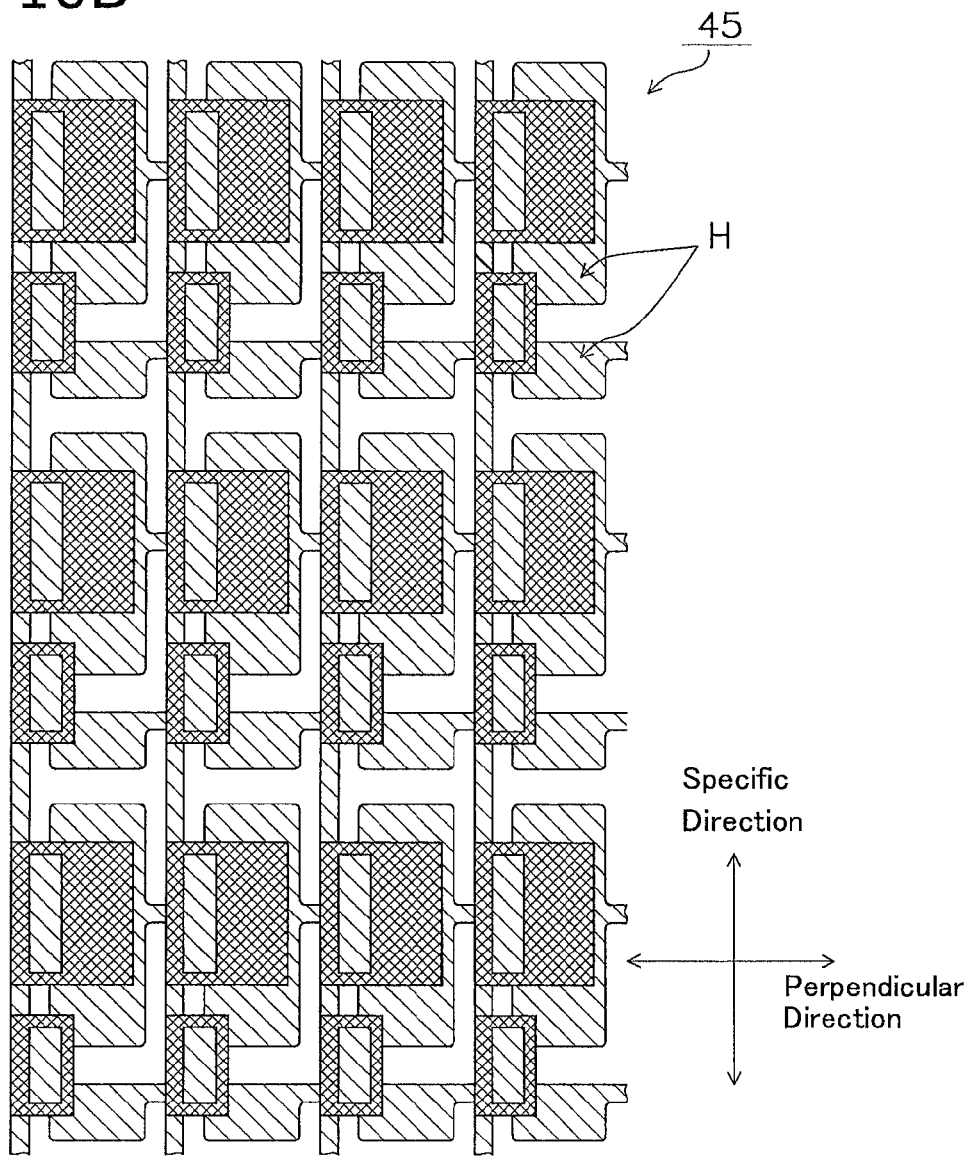
Figure 11:
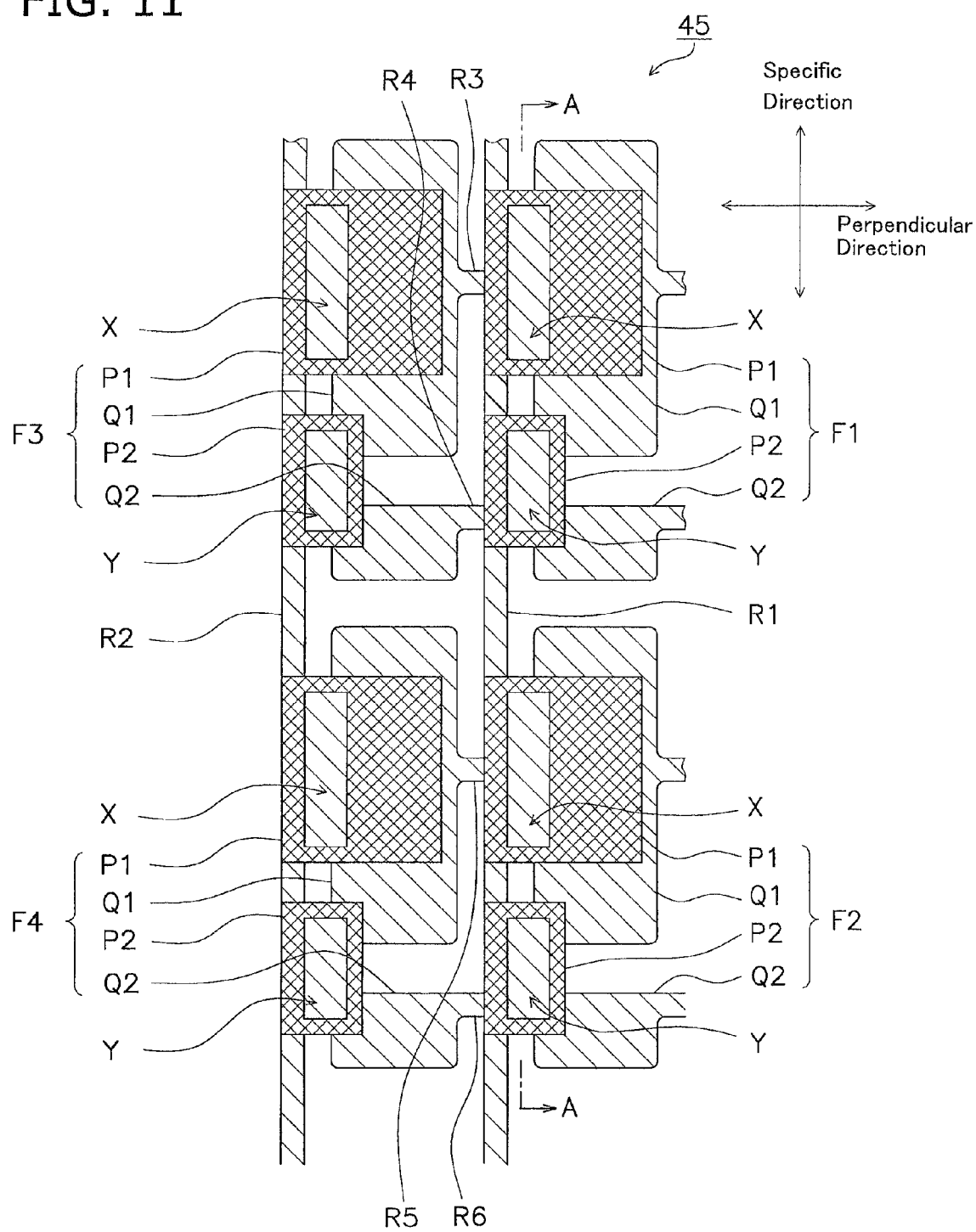
FIG. 11 is a detail view of a lead frame 45 pertaining to the first embodiment.
Figure 12:
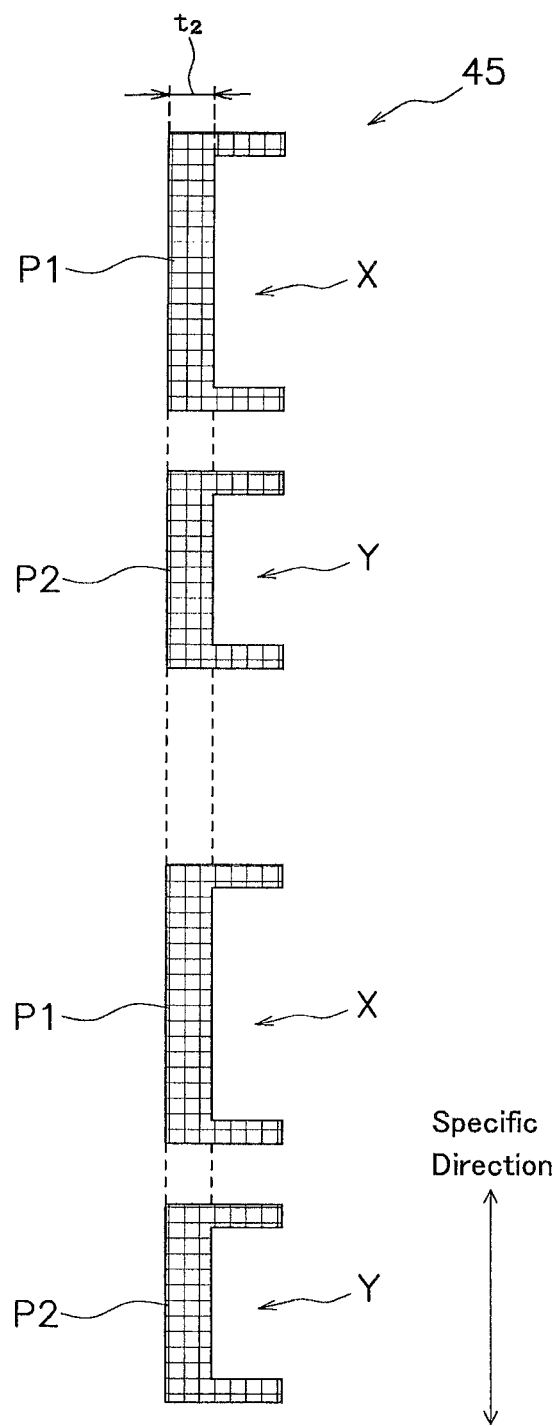
FIG. 12 is a cross section along the A-A line in FIG. 11.
Figure 13:
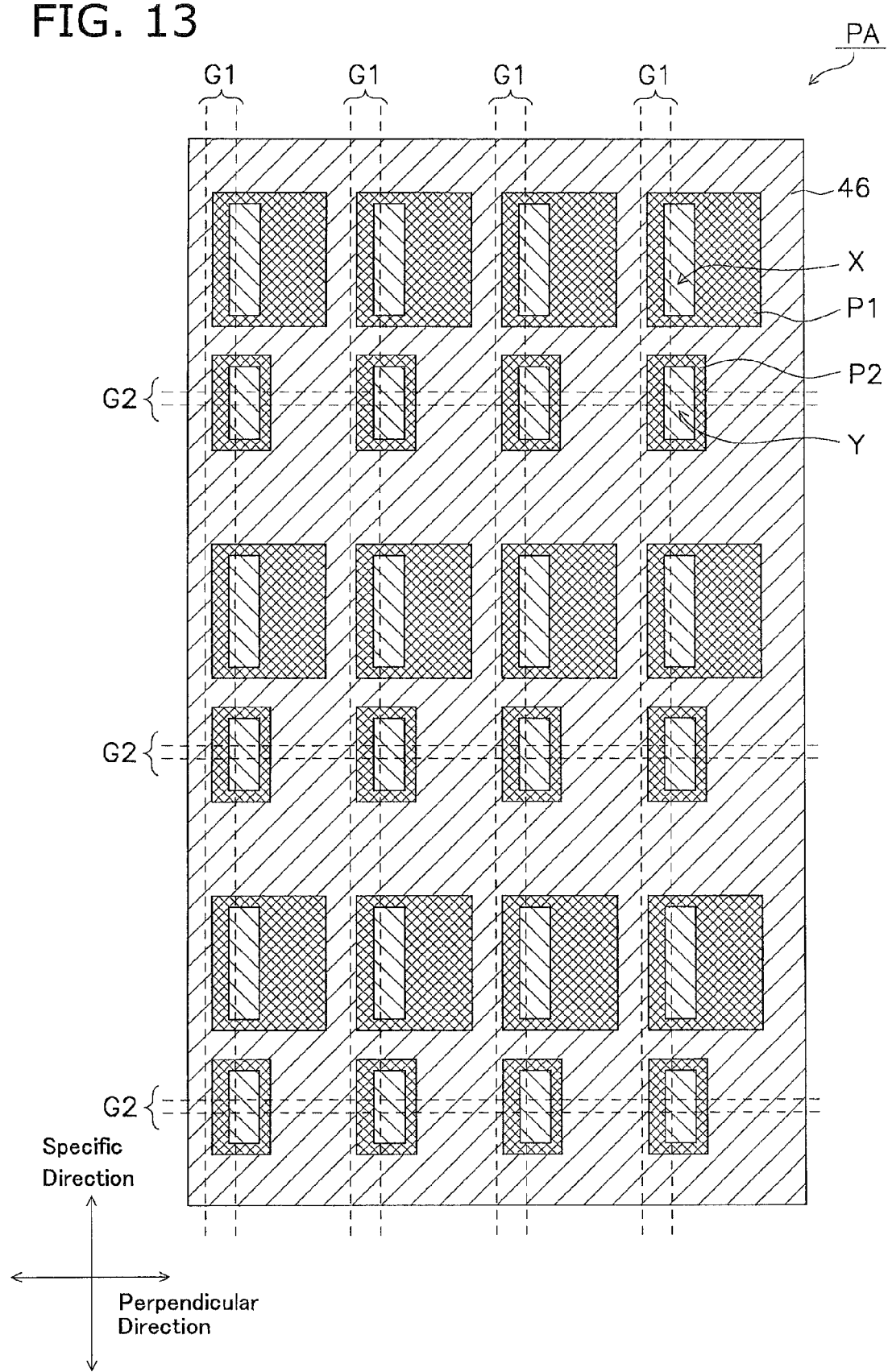
FIG. 13 is a diagram illustrating a method for manufacturing the light emitting device 100 pertaining to the first embodiment.

A method for manufacturing a plurality of the light emitting devices 100 pertaining to the first embodiment all at once will be described through reference to the drawings. FIG. 9A is a cross section of a thin metal plate 451, and FIG. 9B is a plan view of the thin metal plate 451. FIG. 10A is a cross section of a lead frame 45, and FIG. 10B is a plan view of the lead frame 45. FIG. 11 is a detail view of the lead frame 45. FIG. 12 is a cross section along the A-A line in FIG. 11. FIG. 13 is a plan view of a light emitting device package array PA pertaining to this embodiment.

First, the thin metal plate 451 is readied, which has a first main face S1 and a second main face S2 provided opposite the first main face S1. In this embodiment, the thin metal plate 451 has a thickness t$_1$ (such as about 0.5 mm).

Next, as shown in FIG. 9A, a first mask M1 is formed in a specific pattern over the first main face S1, and a second mask M2 is formed in a symmetrical pattern to the first mask M1 over the second main face S2, and the first main face S1 and the second main face S2 are etched at the same time. Consequently, as shown in FIG. 9B, etching holes G are formed in the thin metal plate 451. This etching can be accomplished by dry or wet etching. An etchant that is suitable for the material of the thin metal plate 451 should be selected.

Next, as shown in FIG. 10A, a third mask M3 is formed in a specific pattern over the first main face S1, and a fourth mask M4 is formed over the second main face S2 so as to cover the entire second main face S2, and only the first main face S1 is etched. As shown in FIG. 10B, this completes the lead frame 45, which has etching concavities H formed in the first main face S1. The depth of the etching concavities H is about 0.3 mm, for example. Accordingly, the portion of the thin metal plate 451 in which the etching concavities H are formed has a thickness t$_2$ (such as about 0.2 mm) that is less than the thickness t$_1$.

The configuration of the lead frame 45 formed in this manner will be described in detail through reference to the drawings. As shown in FIG. 11, the lead frame 45 has a first frame part F1, a second frame part F2, a third frame part F3, and a fourth frame part F4.

The first frame part F1 and the second frame part F2 are adjacent to each other in a specific direction, and are linked by a first linking frame R1. The third frame part F3 and the fourth frame part F4 are adjacent to each other in a specific direction, and are linked by a second linking frame R2. The first frame part F1 and the third frame part F3 are adjacent to each other in a perpendicular direction, which is perpendicular to a specific direction (an example of a perpendicular direction), and are linked by a third linking frame R3 and a fourth linking frame R4. The second frame part F2 and the fourth frame part F4 are adjacent to each other in a perpendicular direction, and are linked by a fifth linking frame R5 and a sixth linking frame R6.

The first to fourth frame parts F1 to F4 each have the same configuration, and include a first thick part P1, a second thick part P2, a first thin part Q1, and a second thin part Q2.

The first thick part P1 has a first thickness t$_1$ (that is, the thickness of the thin metal plate 451). In a later step, the first thick part P1 is cut with a dicing saw to form the exposed part 43. The second thick part P2 has the first thickness t$_1$. The second thick part P2 is isolated from the first thick part P1 in a specific direction. In a later step, the second thick part P2 is cut with a dicing saw to form the first terminal part 42 and the second terminal part 52.

The first thin part Q1 has a second thickness t$_2$ (that is, the thickness of the portion of the thin metal plate 451 where the etching concavities H are formed). The first thin part Q1 is linked to the first thick part P1 and the second thick part P2. The first thin part Q1 corresponds to an outer periphery of the mounting part 41 of the light emitting device 100. The second thin part Q2 has the second thickness t$_2$ (that is, the thickness of the portion of the thin metal plate 451 where the etching concavities H are formed). The second thin part Q2 is linked to the first thick part P1, and is isolated from the first thin part Q1 via the etching holes G in a specific direction (see FIG. 9). The second thin part Q2 corresponds to the connector 51 of the light emitting device 100.

In this embodiment, in a plan view of the lead frame 45, a one-sided etching concavity X, which is a part of the etching concavity H, is formed on the inside of the first thick part P1 of each of the frame parts F. As shown in FIG. 12, the portion of the first thick part P1 where the one-sided etching concavities X are formed has the second thickness t$_2$. In a later step, the one-sided etching concavities X are cut with a dicing saw to form the concavity 43S (see FIG. 4).

Similarly, in this embodiment, in a plan view of the lead frame 45D, a one-sided etching concavity Y, which is a part of the etching concavity H, is formed on the inside of the second thick part P2 of each of the frame parts F. As shown in FIG. 12, the portion of the second thick part P2 where the one-sided etching concavities Y are formed has the second thickness $t_2$. In a later step, the one-sided etching concavities Y are cut with a dicing saw to form the first terminal concavity 42S and the second terminal concavity 52S (see FIG. 4).

In this embodiment, the first thin part Q1 of the third frame part F3 is linked via the third linking frame R3 to the first thick part P1 of the first frame part F1. The second thin part Q2 of the third frame part F3 is linked via the fourth linking frame R4 to the second thick part P2 of the first frame part F1. Similarly, the first thin part Q1 of the fourth frame part F4 is linked via the fifth linking frame R5 to the first thick part P1 of the second frame part F2. The second thin part Q2 of the fourth frame part F4 is linked via the sixth linking frame R6 to the second thick part P2 of the second frame part F2.

The first to sixth linking frames R1 to R6 are cut with a dicing saw in a later step (see FIG. 13). That is, the first to sixth linking frames R1 to R6 are cutting allowance for dicing. As shown in FIG. 11, the portion of the first thick part P1 that is linked to the third linking frame R3, and the portion of the second thick part P2 that is linked to the fourth linking frame R4 are disposed in a specific direction, and are cutting allowance for dicing as the first to sixth linking frames R1 to R6.

Next, the lead frame 45 is disposed in a metal mold. More specifically, the lead frame 45 is sandwiched between upper and lower molds.

Next, the molding material that makes up the molded article 30 is injected between the upper and lower molds.

Next, the molding material is transfer molded by being heated at a specific temperature. As shown in FIG. 13, this completes a light emitting device package array PA made up of the lead frame 45 and a molded board 46 in which the lead frame 45 is embedded. Care should be taken with the light emitting device package array PA so that the first thick part P1 and the one-sided etching concavities X, and the second thick part P2 and the one-sided etching concavities Y, are exposed from the molded board 46.

Then, as shown in FIG. 13, a dicing saw is used to cut the light emitting device package array PA along cutting lines G1 and G2 of a specific width. This allows a plurality of light emitting devices 100 to be manufactured all at once.

Action and Effect (1) With the light emitting device 100 pertaining to the first embodiment, the first lead 40 has the exposed part 43. The exposed part 43 is linked to the mounting part 41, and is exposed from the molded article 30 at the bottom face 20A and the first side face $20D_1$ (rear face).

Therefore, heat generated from the light emitting element 10 can be directly released to the outside of the light emitting device 100 from the first lead 40 where the light emitting element 10 is mounted. More specifically, a second heat dissipation path going from the first exposed face 43A to the outside air, or a third heat dissipation path going from the second exposed face 43B to the mounting board 200 is formed. Furthermore, when the second solder fillets 303 (the second solder fillet 303a and/or the second solder fillet 303b) are connected to the exposed part 43, a first heat dissipation path going from the exposed part 43, through the second solder fillet 303a, to the mounting board 200 can be formed.

Thus, a plurality of heat dissipation paths can be formed besides a heat dissipation path that makes use of the first terminal part 42, so heat generated from the light emitting element 10 can be released efficiently from the light emitting device 100.

(2) With the light emitting device 100 pertaining to the first embodiment, the exposed part 43 has the concave component 43S (an example of a "concave component") whose opening is contiguous with the bottom face 20A and the first side face $20D_1$.

Therefore, the pair of second solder fillets 303a and 303b can be connected so as to straddle the inner walls 43S (the first inner wall 43Sa and the second inner wall 43Sb) from above the mounting face 200A. Therefore, when the second solder fillets 303a and 303b solidify and shrink, the tensile force that the second solder fillets 303a and 303b exert on the light emitting device 100 acts on the light emitting device 100 along the first direction. Therefore, the tensile force of the second solder fillets 303a and 303b will have less of an adverse effect on the balance of the light emitting device 100. This effect is particularly pronounced with a side view type of light emitting device 100 that has the characteristic of being prone to toppling.

(3) With the light emitting device 100 pertaining to the first embodiment, the concave component 43S extends along the first direction. Therefore, the mutually opposing second solder fillets 303a and 303b can be easily disposed inside the concave component 43S. Accordingly, the tensile force exerted by the second solder fillet 303a on the first inner wall 43Sa and the tensile force exerted by the second solder fillet 303b on the second inner wall 43Sb cancel each other out. As a result, the balance of the light emitting device 100 can be further enhanced.

(4) With the light emitting device 100 pertaining to the first embodiment, the exposed part 43 is larger than the first terminal part 42 in a plan view of the first side face $20D_1$. Therefore, the heat dissipation effect in the above-mentioned first heat dissipation path will be greater than the heat dissipation effect in the fourth heat dissipation path, so heat can be dissipated from the light emitting element 10 more efficiently.

(5) With the light emitting device 100 pertaining to the first embodiment, the exposed part 43 is disposed on the opposite side of the light emitting element 10 with the mounting part 41 in between. Therefore, the distance that the heat generated by the light emitting element 10 moves inside the mounting part 41 can be shortened. Accordingly, thermal transfer efficiency from the light emitting element 10 to the exposed part 43 can be improved.

(6) The circuit board 300 pertaining to the first embodiment has the pair of second solder fillets 303a and 303b (an example of "second solder fillets") connected to the exposed part 43 and the mounting board 200. Therefore, a first heat dissipation path is formed by the pair of second solder fillets 303a and 303b, so heat can be transmitted efficiently from the light emitting device 100 to the mounting board 200.

(7) With the circuit board 300 pertaining to the first embodiment, the second solder fillet 303a is connected straddling the mounting face 200A and the first inner wall 43Sa. Similarly, the second solder fillet 303b is connected straddling the mounting face 200A and the second inner wall 43Sb.

Therefore, when the second solder fillets 303a and 303b solidify and shrink, the tensile force that the second solder fillets 303a and 303b exert on the light emitting device 100 acts on the light emitting device 100 along the first direction. Therefore, the tensile force of the second solder fillets 303a and 303b will have less of an adverse effect on the balance of the light emitting device 100. This effect is particularly pronounced with a side view type of light emitting device 100 that has the characteristic of being prone to toppling.

Second Embodiment

Next, a second embodiment will be described through reference to the drawings. The difference between the first and second embodiments is that the interior of the concave component 43S is divided up into a plurality of spaces. The following description will focus on this difference.

Configuration of Light Emitting Device

Figure 14:
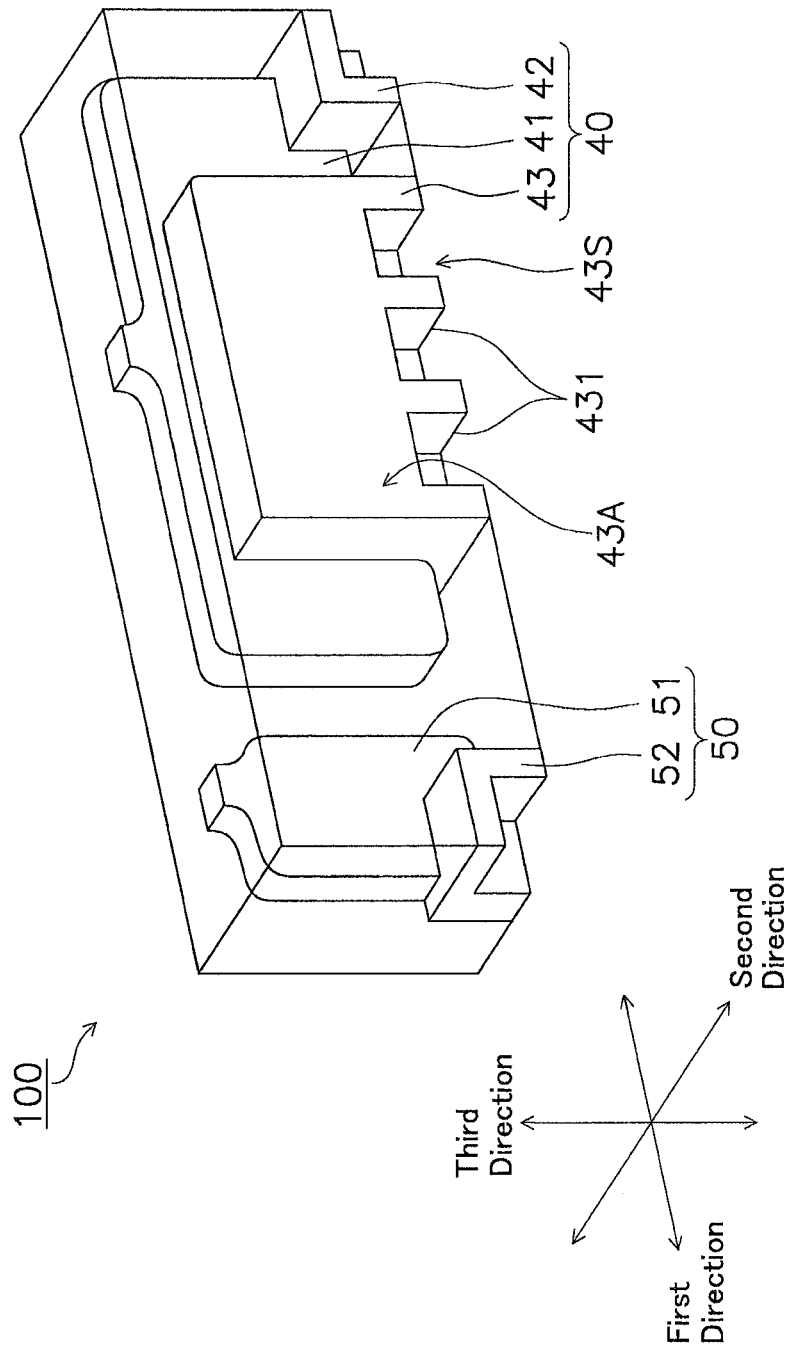
FIG. 14 is an oblique see-through view of the light emitting device 100 pertaining to the second embodiment, as seen from the rear.

FIG. 14 is a see-through oblique view of the light emitting device 100 pertaining to the second embodiment as seen from behind. As shown in FIG. 14, the exposed part 43 of the light emitting device 100 has a first partition 431, a second partition 432, a first solder holder 433, a second solder holder 434, and a third solder holder 435. In this embodiment, the first partition 431, the second partition 432, the first solder holder 433, the second solder holder 434, and the third solder holder 435 constitute the concave component 43S.

The first partition 431 and the second partition 432 each divide the interior space of the concave component 43S into two spaces in the first direction. Therefore, in this embodiment the interior space of the concave component 43S is divided into three spaces.

The first solder holder 433, the second solder holder 434, and the third solder holder 435 respectively encompass the three spaces divided up by the first partition 431 and the second partition 432.

Although not depicted in the drawings, the second solder fillet 303a is disposed in the first solder holder 433, and the second solder fillet 303b is disposed in the third solder holder 435. The second solder fillet 303a is blocked by the first partition 431, and does not flow into the second solder holder 434. The second solder fillet 303b is blocked by the first partition 431, and does not flow into the second solder holder 434. Another solder fillet (not shown) is disposed in the second solder holder 434.

Method for Manufacturing Light Emitting Device

Figure 15:
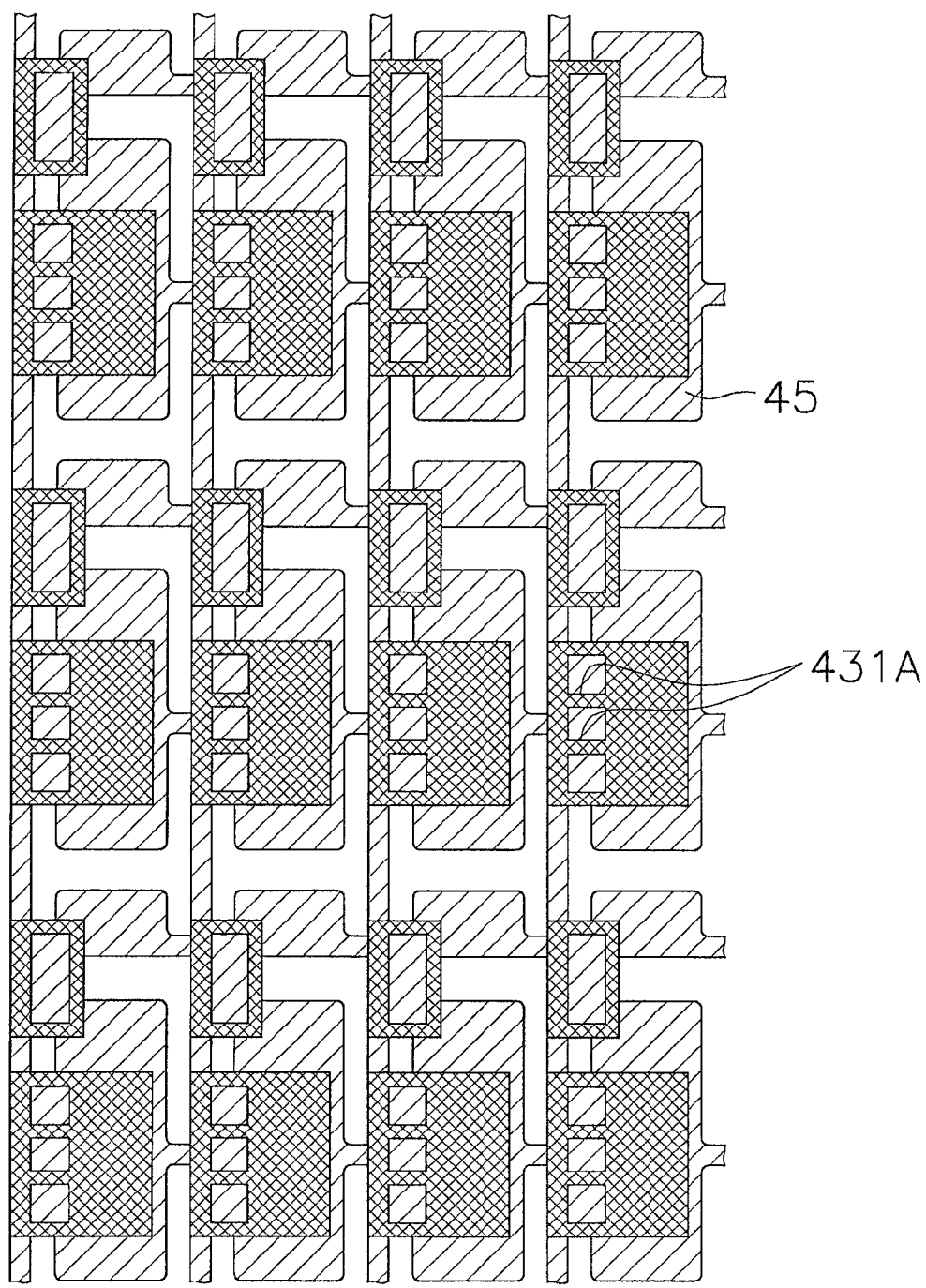
FIG. 15 is a diagram illustrating a method for manufacturing the light emitting device 100 pertaining to the second embodiment.

First, a lead frame 45A is readied as shown in FIG. 15. The lead frame 45A comprises a first partition base 431A, a second partition base 431A, a first solder holder base 433A, a second solder holder base 434A, and a third solder holder base 435A.

This lead frame 45A can be formed by setting a narrow region in which one-sided etching is performed on a thin metal plate. More specifically, the first partition base 431A and the second partition base 431A are formed by subjecting the region in which the first solder holder 433, the second solder holder 434, and the third solder holder 435 are formed to one-sided etching to the same depth as the first terminal concave component 42S and the second terminal concave component 52S.

Next, the lead frame 45A is embedded in the molded board 46 (see FIG. 13) by transfer molding.

Next, a dicing saw is used to cut the lead frame 45A and the molded board 46 along a cut line of a specific width (see FIG. 13).

Action and Effect

With the light emitting device 100 pertaining to the second embodiment, the exposed part 43 has the first partition 431 and the second partition 432 that divide up the interior of the concave component 43S into two spaces.

Therefore, with the light emitting device 100 pertaining to the second embodiment, the second solder fillet 303a is held in the first solder holder 433 by the first partition 431, and the second solder fillet 303b is held in the third solder holder 435 by the second partition 432. Accordingly, the pair of second solder fillets 303a and 303b will spread out less inside the concave component 43S, and this further improves the balance of the light emitting device 100. Also, since another solder fillet can be disposed in the second solder holder 434, the heat dissipation efficiency of the light emitting device 100 can be further enhanced.

Third Embodiment

Next, a third embodiment will be described through reference to the drawings. The difference between the first and third embodiments is that the exposed part 43 functions as an external terminal. The following description will focus on this difference.

Configuration of Mounting Board

Figure 16:
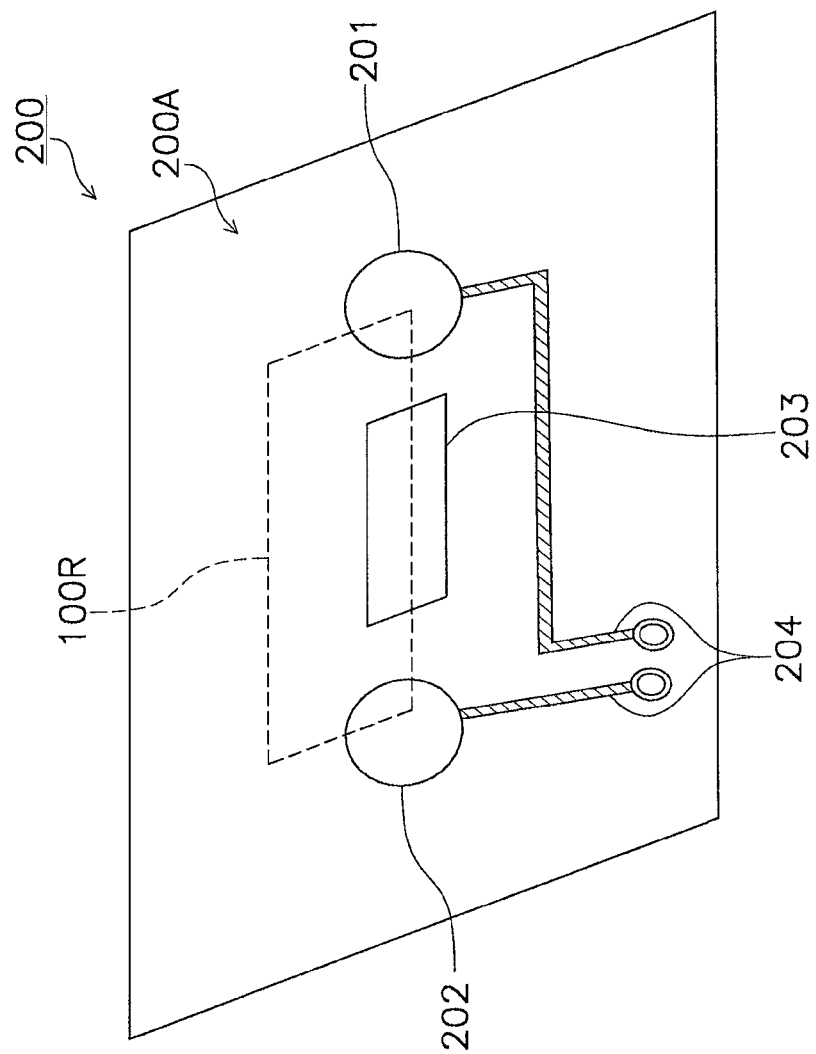
FIG. 16 is an oblique view of a mounting board 200 pertaining to the third embodiment, as seen from a mounting face side.

FIG. 16 is an oblique view of the mounting board 200 pertaining to the third embodiment. As shown in FIG. 16, the mounting board 200 has a third land 203. The third land 203 is separated from the first land 201 and the second land 202, and is electrically isolated from the electrical circuit 204.

Configuration of Circuit Board

Figure 17:
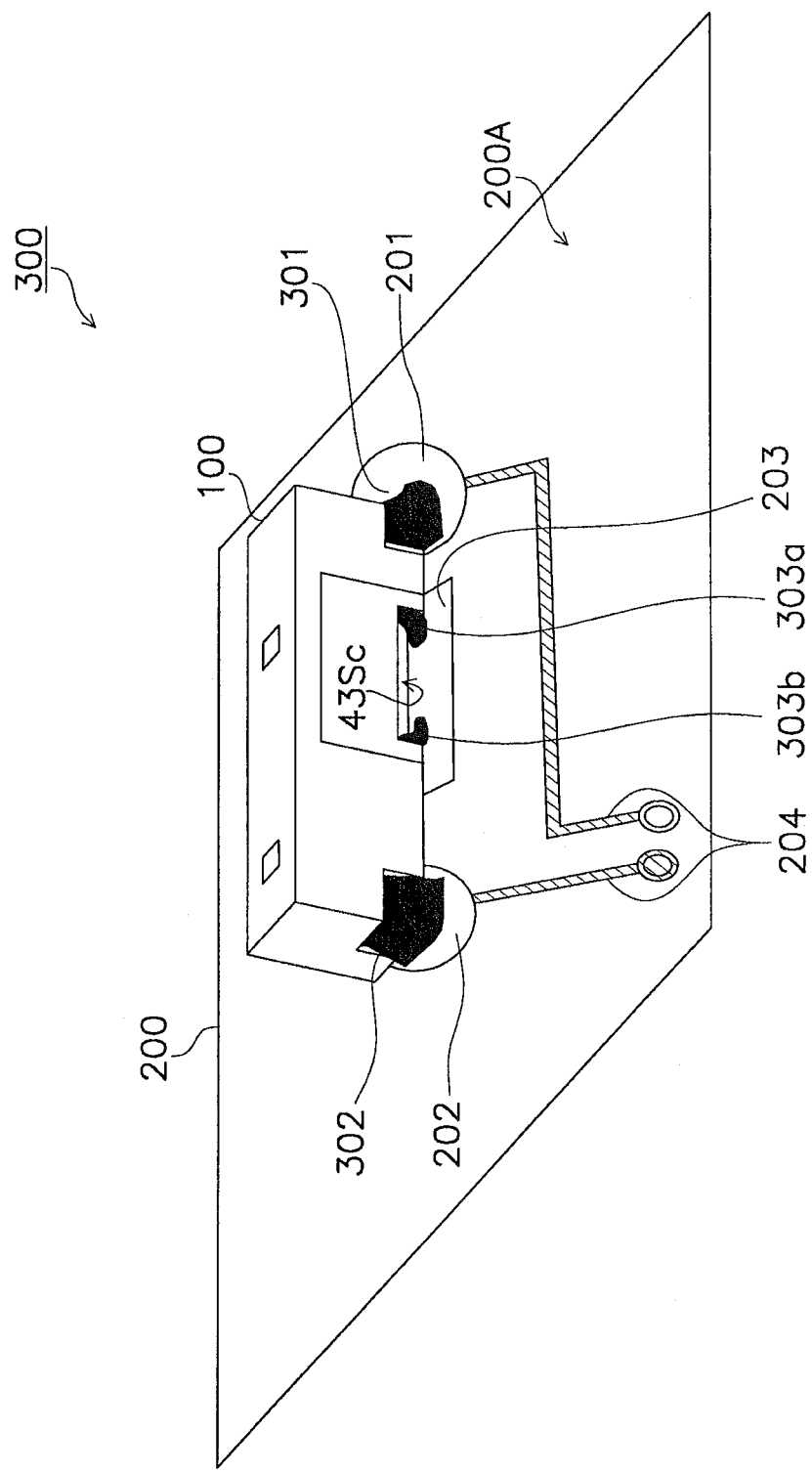
FIG. 17 is an oblique view of a circuit board 300 pertaining to the third embodiment, as seen from the mounting face side.

FIG. 17 is an oblique view of the circuit board 300 pertaining to the third embodiment. As shown in FIG. 17, when the light emitting device 100 is mounted on the mounting board 200, the exposed part 43 is mechanically and thermally connected to the third land 203 by the pair of second solder fillets 303a and 303b.

Also, the exposed part 43 is electrically connected to the third land 203 via the pair of second solder fillets 303a and 303b, but since the third land 203 is electrically isolated from the electrical circuit 204, the exposed part 43 does not function as an external terminal.

Fourth Embodiment

Next, a fourth embodiment will be described through reference to the drawings. The difference between the first and fourth embodiments is that a part of the second lead 50 extends toward the first side face $20D_1$. The following description will focus on this difference.

Configuration of Light Emitting Device

Figure 18:
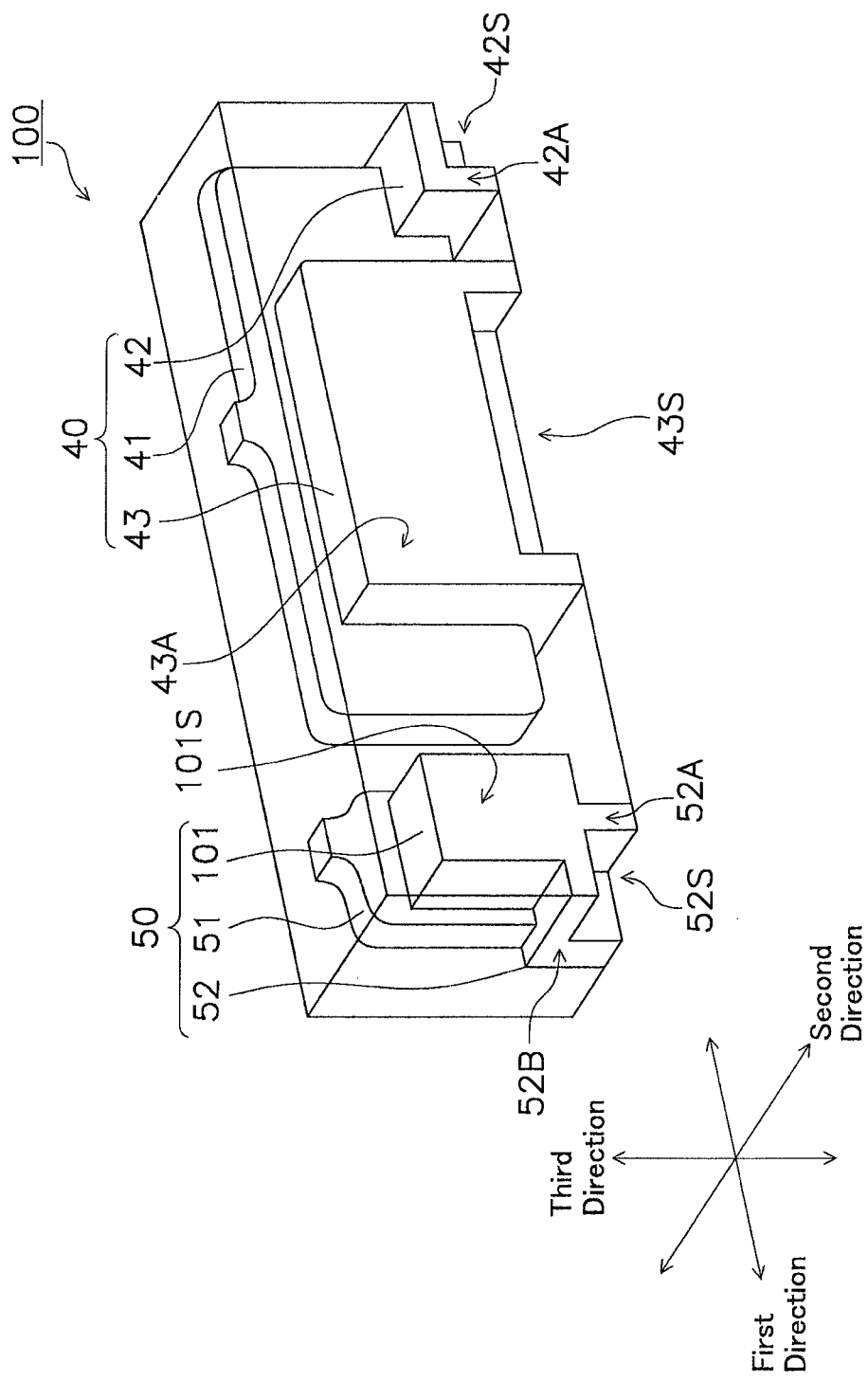
FIG. 18 is an oblique see-through view of the light emitting device 100 pertaining to the fourth embodiment, as seen from the rear.

FIG. 18 is an oblique see-through view of a light emitting device 100 pertaining to a fourth embodiment, as seen from the rear. As shown in FIG. 18, with the light emitting device 100, the second lead 50 has a first extension 101.

The first extension 101 is disposed on the connector 51, and is connected to the second terminal part 52. The first extension 101 extends from the surface of the connector 51 on the first side face $20D_1$ side, toward the first side face $20D_1$, and is exposed from the molded article 30 at the first side face $20D_1$. The first extension 101 has a first extension face 101S that forms part of the first side face $20D_1$.

Method for Manufacturing Light Emitting Device

Figure 19:
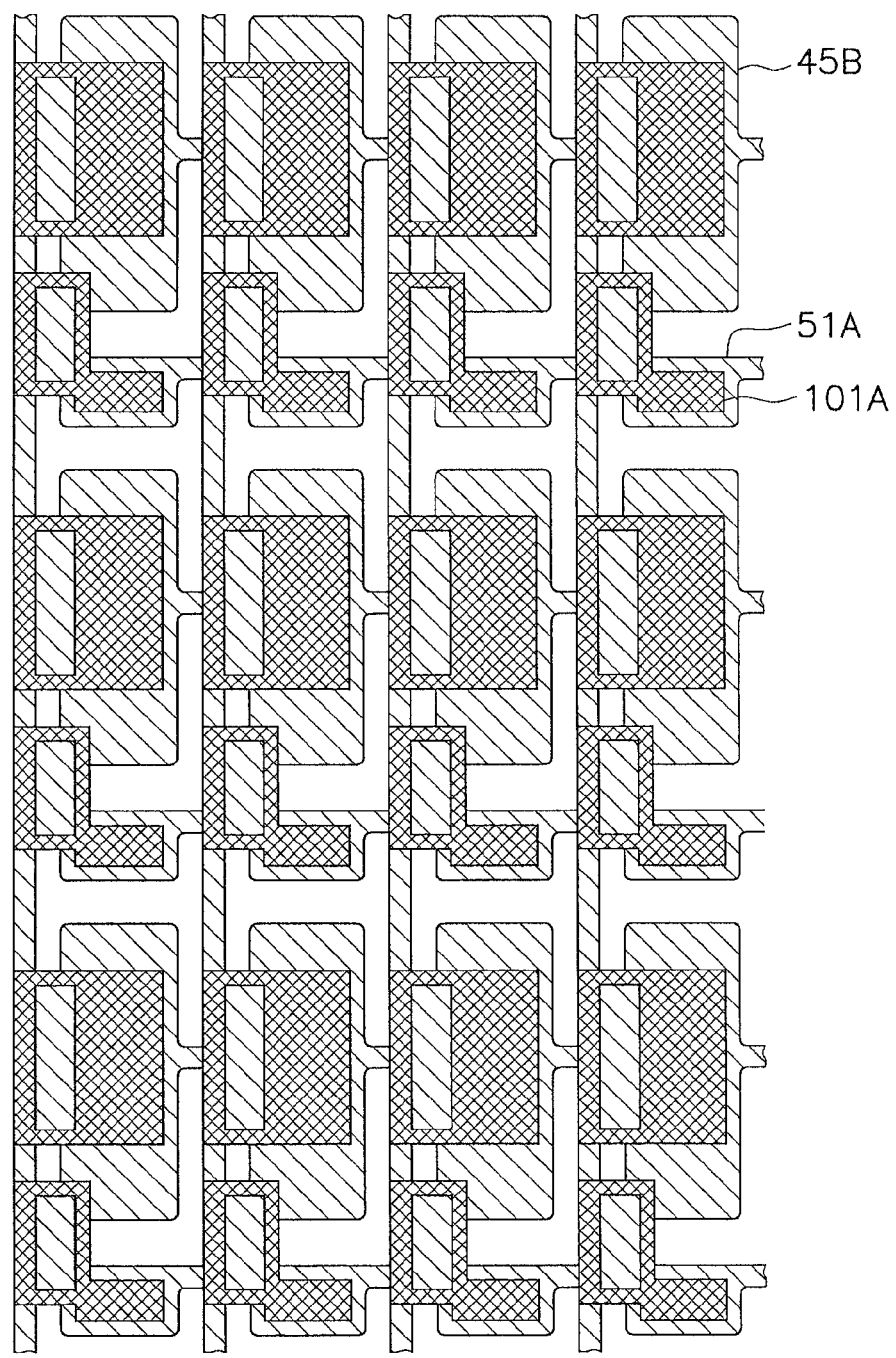
FIG. 19 is a diagram illustrating a method for manufacturing the light emitting device 100 pertaining to the fourth embodiment.

First, the lead frame 45B shown in FIG. 19 is readied. The lead frame 45B comprises a first extension base 101A. This lead frame 45B can be formed by setting the region in which one-sided etching is performed in order to form a connection base 51A in C-Shape.

Next, the lead frame 45B is embedded in a molded board 46 (see FIG. 13) by transfer molding.

Next, the lead frame 45B and the molded board 46 are cut along the cutting line (see FIG. 13) having a specific width with a dicing saw.

Action and Effect

With the light emitting device 100 pertaining to the fourth embodiment, the second lead 50 has the first extension 101. The first extension 101 is disposed on the connector 51 and connected to the second terminal part 52. The first extension 101 is exposed from the molded article 30 at the first side face $20D_1$.

Since the first extension 101 is thus exposed from the molded article 30 at the first side face $20D_1$, a heat dissipation path of "light emitting element 10→molded article 30→second wire 12→connector 51 first extension 101→first extension face 101S→outside air" can be formed. Accordingly, heat generated from the light emitting element 10 can be released more efficiently from the light emitting device 100.

Also, since the first extension 101 is connected to the second terminal part 52, a heat dissipation path of "light emitting element 10→molded article 30→second wire 12→connector 51→first extension 101→second terminal part 52→mounting board 200" can be formed. Accordingly, heat generated from the light emitting element 10 can be released more efficiently from the light emitting device 100.

Also, the first extension face 101S is exposed at the outermost face of the molded article 30. Specifically, in the process of manufacturing the molded article 30, the first extension 101 hits the inner face of the mold. Consequently, since the connector 51 is supported by the first extension 101, the tiny vibrations of the connector 51 caused by the injected resin material can be suppressed. Therefore, the resin material can work its way evenly around the connector 51, so there is better adhesion between the molded article 30 and the second lead 50.

Fifth Embodiment

Next, a fifth embodiment will be described through reference to the drawings. The difference between the fourth and fifth embodiments is that part of the first lead 40 also sticks out toward the first side face $20D_1$ (rear face). The following description will focus on this difference.

Configuration of Light Emitting Device

Figure 20:
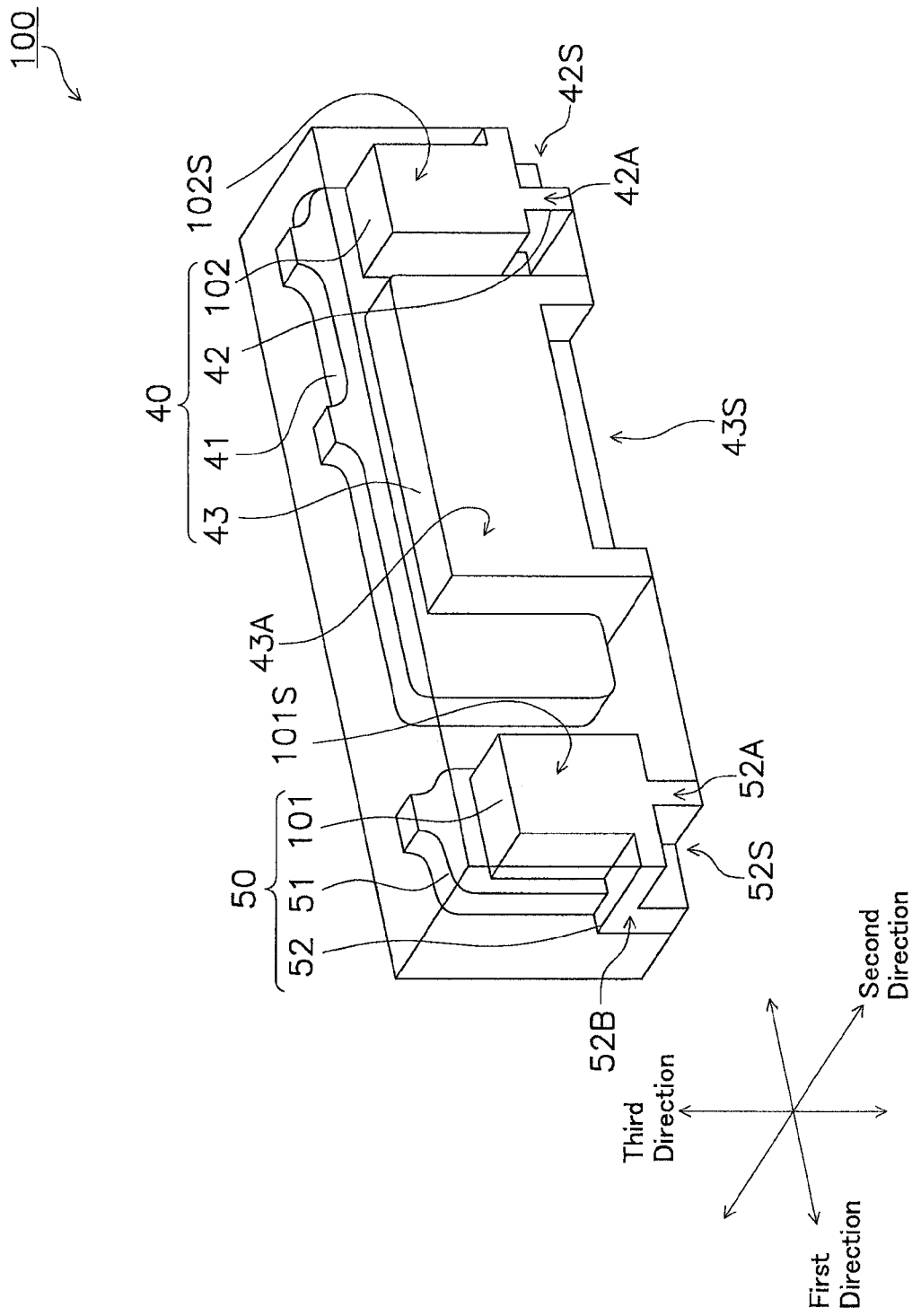
FIG. 20 is an oblique see-through view of a light emitting device 100 pertaining to a fifth embodiment, as seen from the rear.

FIG. 20 is an oblique see-through view of a light emitting device 100 pertaining to a fifth embodiment, as seen from the rear. As shown in FIG. 20, with the light emitting device 100, the first lead 40 has a second extension 102, and the second lead 50 has a first extension 101.

The configuration of the first extension 101 is as described above in the fourth embodiment.

The configuration of the second extension 102 is the same as the configuration of the first extension 101. The second extension 102 is disposed on the mounting part 41, and is connected to the first terminal part 42. The second extension 102 extends from the surface of the mounting part 41 on the first side face $20D_1$ side toward the first side face $20D_1$, and is exposed from the molded article 30 at the first side face $20D_1$.

The second extension 102 has a second extension face 102S that forms part of the first side face $20D_1$.

Method for Manufacturing Light Emitting Devices

Figure 21:
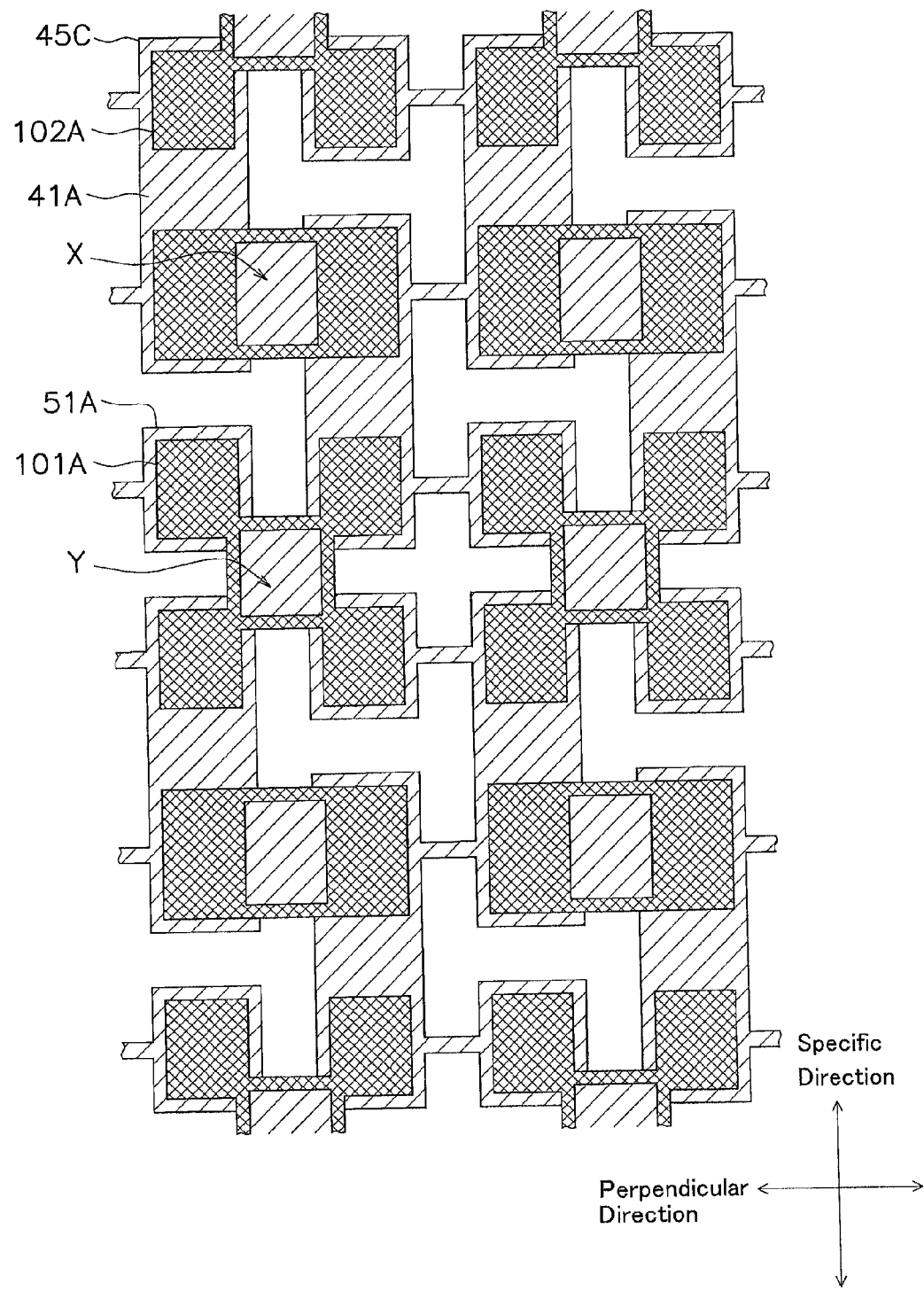
FIG. 21 is a diagram illustrating a method for manufacturing the light emitting device 100 pertaining to the fifth embodiment.

First, the lead frame 45C shown in FIG. 21 is readied. The lead frame 45 C comprises a first extension base 101A and a second extension base 101B. This lead frame 45C can be formed by setting the region in which one-sided etching is performed in order to form a first connection base 41A and a second connection base 51A, as shown in FIG. 21.

With the lead frame 45C pertaining to this embodiment, the one-sided etching concavities X and the one-sided etching concavities Y are set to be larger than the lead frame 45 pertaining to the first embodiment. This raises the dimensional machining limit at which one-sided etching.

Figure 22:
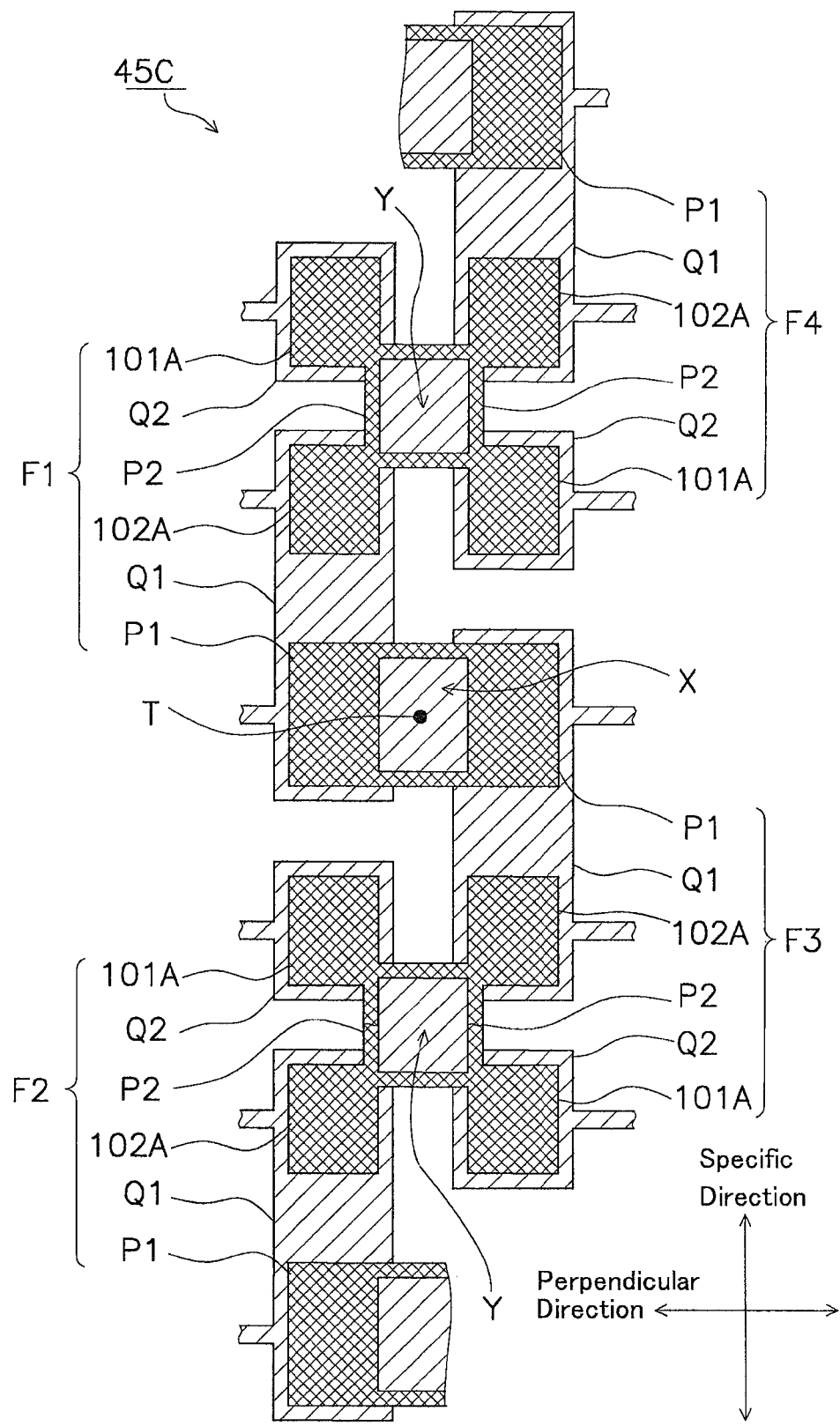
FIG. 22 is a detail view of a lead frame 45C pertaining to the fifth embodiment.

Thus, the lead frame 45C pertaining to this embodiment has a fundamentally different configuration from that of the lead frame 45 pertaining to the first embodiment. The detailed configuration of the lead frame 45C will now be described through reference to the drawings. FIG. 22 is a detail view of the lead frame 45C. As shown in FIG. 22, the lead frame 45C has first to fourth frame parts F1 to F4. The first frame part F1 and the second frame part F2 are adjacent to each other in a specific direction, but are not linked. Similarly, the third frame part F3 and the fourth frame part F4 are adjacent to each other in a specific direction, but are not linked.

In this embodiment, the third frame part F3 and the fourth frame part F4 are disposed in rotational symmetry with respect to the first frame part F1 and the second frame part F2 around an axis T that is parallel to the thickness direction (a direction that is perpendicular to the specific direction and the perpendicular direction, that is, a direction that is perpendicular to the plane of the drawing). The first thick part P1 of the third frame part F3 is directly linked to the first thick part P1 of the first frame part F1. The second thick part P2 of the third frame part F3 is directly linked to the second thick part P2 of the second frame part F2. The second thick part P2 of the fourth frame part F4 is directly linked to the second thick part P2 of the first frame part F1.

Also, in this embodiment, in a plan view of the lead frame 45D, part of the etching concavities H is formed on the inside of the first thick part P1 of the frame parts F. Consequently, the one-side etching concavities X are formed by linking the first thick part P1 of the third frame part F3 and the first thick part P1 of the first frame part F1.

In this embodiment, in a plan view of the lead frame 45D, part of the etching concavities H is formed on the inside of the second thick part P2 of the frame parts. Consequently, the one-side etching concavities Y are formed by linking the second thick part P2 of the first frame part F1 and the second thick part P2 of the fourth frame part F4. Also, the one-side etching concavities Y are formed by linking the second thick part P2 of the second frame part F2 and the second thick part P2 of the third frame part F3.

The portion where the first thick part P1 of the third frame part F3 and the first thick part P1 of the first frame part F1 are linked constitutes a cutting allowance for dicing (see FIG. 23). Similarly, the portion where the second thick part P2 of the third frame part F3 and the second thick part P2 of the second frame part F2 are linked constitutes a cutting allowance for dicing. The portion where the second thick part P2 of the fourth frame part F4 and the second thick part P2 of the first frame part F1 are linked also constitutes a cutting allowance for dicing.

Next, as shown in FIG. 23, the light emitting device package array PA is completed by embedding the lead frame 45C in a molded board 46 by transfer molding. It should be noted that the first thick part P1 and the one-side etching concavities X, and the second thick part P2 and the one-side etching concavities Y are exposed from the molded board 46 in the light emitting device package array PA.

Next, as shown in FIG. 23, the light emitting device package array PA is cut with a dicing saw along cutting lines H1 and H2 having a specific width.

Action and Effect

With the light emitting device 100 pertaining to the fifth embodiment, the first lead 40 has the second extension 102. The second extension 102 is disposed on the mounting part 41 and connected to the first terminal part 42. The second extension 102 is exposed from the molded article 30 at the first side face $20D_1$.

Since the second extension 102 is thus exposed from the molded article 30 at the first side face $20D_1$, a heat dissipation path of "light emitting element 10→mounting part 41→second extension 102→second extension face 102S→outside air" can be formed. Accordingly, heat generated from the light emitting element 10 can be released more efficiently from the light emitting device 100.

Also, since the second extension 102 is connected to the first terminal part 42, a heat dissipation path of "light emitting element 10→mounting part 41→second extension 102→first terminal part 42→mounting board 200" can be formed. Accordingly, heat generated from the light emitting element 10 can be released more efficiently from the light emitting device 100.

Also, the second extension face 102S is exposed at the outermost face of the molded article 30. Specifically, in the process of manufacturing the molded article 30, the second extension 102 hits the inner face of the mold. Consequently, since the mounting part 41 is supported by the second extension 102, the tiny vibrations of the mounting part 41 caused by the injected resin material can be suppressed. Therefore, the resin material can work its way evenly around the mounting part 41, so there is better adhesion between the molded article 30 and the first lead 40.

The effect produced by the second lead 50 having the first extension 101 is the same as described in the fourth embodiment above.

Other Embodiments

The present invention was described by the above embodiments, but the text and drawings that make up part of this disclosure should not be construed as limiting this invention. Various alternative embodiments, working examples, and applied technology will be apparent to a person skilled in the art from this disclosure.

(A) In the above embodiment, a so-called side view type of light emitting device 100 was described, but this is not the only option, and the exposed part 43 can also be applied to a so-called top view type of light emitting device in which light that is perpendicular to the mounting face 200A is emitted from the light emitting element 10.

(B) In the above embodiments, the exposed part 43 had the concavity 43S, but this is not the only option. The exposed part 43 need not have the concavity 43S. Here again, heat can be effectively dispersed from the first exposed face 43A and the second exposed face 43B.

(C) In the above embodiment, the pair of second solder fillets 303a and 303b was formed, but this is not the only option. For example, just one of the second solder fillets 303a and 303b may be formed, or another solder fillet may be formed in addition to the pair of second solder fillets 303a and 303b. The greater is the number of solder fillets, the more securely the light emitting device 100 and the mounting board 200 can be connected.

(D) In the above embodiment, the second solder fillets 303a and 303b were separated from one another in the concave component 43S, but this is not the only option. The second solder fillets 303a and 303b may be linked to one another. Specifically, a single second solder fillet 303 may be formed that extends in the first direction from the first inner wall 43Sa to the second inner wall 43Sb. This improves adhesion between the light emitting device 100 and the mounting board 200, and further enhances the efficiency of heat dissipation from the exposed part 43 to the mounting board 200.

(E) In the above embodiment, the light emitting device 100 comprised just one light emitting element 10, but this is not the only option. The light emitting device 100 may comprise a plurality of light emitting elements 10 that are linked together. In this case, the light emitting elements 10 may all be the same type, or different types emitting in red, green, and blue (the three primary colors of light) may be combined.

(F) In the above embodiment, the outer shape of the light emitting device 100 was substantially cuboid, having six sides (the bottom face 20A, the top face 20B, the front face 20C, the first side face $20D_1$, the second side face $20D_2$, and the third side face 20D3), but this is not the only option. The light emitting device 100 need only have a bottom face and at least one side face. Therefore, the outer shape of the light emitting device 100 may be that of a circular cylinder or an elliptical cylinder.

(G) In the above embodiment, the mounting part 41 was formed in a flat shape, the exposed part 43 was formed in an L shape, and the first terminal part 42 and the second terminal part 52 were formed in cuboid shapes, but this is not the only option. The outer shape and so forth of the light emitting device 100 can be varied as needed.

(H) In the above embodiment, the lead frame 45A was formed by etching a thin metal plate, but this is not the only option. For example, the lead frame 45A can be formed by punching out a plurality of thin metal plates into the desired shape and then press-fitting them together.

Thus, the present invention of course encompasses various embodiments, etc., that are not discussed herein. Therefore the technological scope of the present invention is defined only by the invention-defining matters pertaining to the appropriate claims from the above description.

The technology disclosed herein can be utilized in the field of light emitting devices because it allows heat to be dissipated efficiently from a light emitting element.

REFERENCE SIGNS LIST 100 light emitting device; 10 light emitting element; 11 first wire; 12 second wire; 20 package; 20A bottom face; 20B top face; 20C front face; $20D_1$ first side face; 30 molded article; 40 first lead; 41 mounting part; 42 first terminal part; 43 exposed part; 43S concavity; 43A first exposed face; 43B second exposed face; 44 first exposed part; 45 lead frame; 451 thin metal plate; 46 molded board; 50 second lead; 51 connector; 52 second terminal part; 60 sealing resin; 101 first extension; 102 second extension; 200 mounting board; 200A mounting face; 201 first land; 202 second land; 203 third land; 204 electrical circuit; 300 circuit board; 301 first solder fillet; 303a, 303b second solder fillet; 302 third solder fillet; S main face; M mask; F frame part; G etching hole; H etching concavity; P thick part; Q thin part; R linking frame; PA light emitting device package array; and X,Y one-sided etching concavity.

What is claimed is:

1. A light emitting device comprising:
a package including a molded article, a lead embedded in the molded article, a light emission face, a rear face, a first side face, a second side face, and a bottom face,
the rear face opposite to the light emission face,
the first side face communicating with the light emission face and the rear face,
the second side face opposite to the first side face and communicating the light emission face and the rear face,
the bottom face communicating the light emission face, the first side face, the second side face, and the rear face,
the lead being a one-piece, unitary member including a mounting part, a terminal part and an exposed part,
the mounting part including a light emission face side defining at least a part of a front face of the lead,
the terminal part exposed from the molded article at the bottom face, and one of the first side face or the second side face,
the exposed part:
defining at least a part of a rear face of the lead,
linked to a rear face side of the mounting part,
exposed from the molded article at the rear face, and
unexposed from the molded article at the first side face and the second side face; and
a light emitting element mounted on the light emission face side of the mounting part,
a surface area of the exposed part exposed from the rear face being greater than the surface area of the terminal part exposed from the rear face.

2. The light emitting device according to claim 1, wherein the exposed part has a concave component that continuously opens on the bottom face and the rear face of the package.

3. The light emitting device according to claim 2, wherein the concave component extends in a first direction parallel to a boundary between the bottom face and the rear face of the package.

4. The light emitting device according to claim 3, wherein the exposed part has a partition that divides an interior of the concave component into two spaces arranged in the first direction.

5. The light emitting device according to claim 1, wherein the lead includes an extension that is disposed on the mounting part and is exposed from the molded article at the rear face of the package, and
the extension is connected to the terminal part.

6. The light emitting device according to claim 1, wherein the terminal part is exposed from the rear face of the package, and
the exposed part is larger than the terminal part in a plan view of the rear face of the package.

7. The light emitting device according to claim 1, wherein the exposed part is disposed on an opposite side from the light emitting element with the mounting part in between.

8. The light emitting device according to claim 1, wherein a height of the exposed part is greater than a height of the terminal part.

9. The light emitting device according to claim 1, wherein a width of the exposed part is greater than a width of the terminal part.

10. The light emitting device according to claim 1, wherein
a height of the exposed part is greater than a height of the terminal part, and
a width of the exposed part is greater than a width of the terminal part.

11. A circuit board, comprising:
a light emitting device;
a mounting board on which the light emitting device is mounted; and
a first solder fillet and a second solder fillet disposed on the mounting board,
the light emitting device having:
a package including a molded article, a lead embedded in the molded article, a light emission face, a rear face, a first side face, a second side face, and a bottom face,
the rear face opposite to the light emission face,
the first side face communicating with the light emission face and the rear face,
the second side face opposite to the first side face and communicating the light emission face and the rear face,
the bottom face communicating the light emission face, the first side face, the second side face, and the rear face,
the lead being a one-piece, unitary member including a mounting part, a terminal part and an exposed part,
the mounting part including a light emission face side defining at least a part of a front face of the lead,
the terminal part exposed from the molded article at the bottom face, and one of the first side face or the second side face,
the exposed part:
defining at least a part of a rear face of the lead,
linked to a rear face side of the mounting part,
exposed from the molded article at the rear face, and
unexposed from the molded article at the first side face and the second side face; and
a light emitting element mounted on the light emission face side of the mounting part,
the first solder fillet connected to the terminal part and the mounting board,
the second solder fillet connected to the exposed part and the mounting board, and
a surface area of the exposed part exposed from the rear face being greater than the surface area of the terminal part exposed from the rear face.

12. The circuit board according to claim 11, wherein
the exposed part has a concave component that continuously opens on the bottom face and the rear face of the package,
the concave component includes an inner wall that intersects a first direction parallel to a boundary between the bottom face and the rear face of the package,
the second solder fillet is connected to the mounting board and the inner wall, and
a light emitted by the light emitting element is emitted along a second direction perpendicular to the rear face of the package.

* * * * *